United States Patent [19]
Yonemizu et al.

[11] Patent Number: 5,975,097
[45] Date of Patent: Nov. 2, 1999

[54] PROCESSING APPARATUS FOR TARGET PROCESSING SUBSTRATE

[75] Inventors: Akira Yonemizu, Kumamoto; Hiroyuki Kudou, Nishikoshimachi; Masami Akimoto, Kumamoto, all of Japan

[73] Assignee: Tokyo Electron Limited, Tokyo, Japan

[21] Appl. No.: 08/917,619

[22] Filed: Aug. 26, 1997

[30]     Foreign Application Priority Data

Sep. 2, 1996   [JP]   Japan .................................. 8-231899
  Sep. 2, 1996   [JP]   Japan .................................. 8-231900

[51] Int. Cl.⁶ ...................................................... B08B 3/02
[52] U.S. Cl. .......................... 134/95.2; 134/147; 134/153; 134/902
[58] Field of Search ..................................... 134/902, 181, 134/108, 147, 153, 95.2, 111; 68/902

[56]              References Cited

U.S. PATENT DOCUMENTS

| | | | |
|---|---|---|---|
| 2,764,722 | 9/1956 | McKeown | 68/902 |
| 2,877,788 | 3/1959 | Clark | 68/902 |
| 2,884,947 | 5/1959 | Gerhardt | 68/902 |
| 4,871,417 | 10/1989 | Nishizawa et al. | 134/902 |
| 5,301,701 | 4/1994 | Nafziger | 134/95.2 |
| 5,469,876 | 11/1995 | Gray et al. | 134/105 |
| 5,488,964 | 2/1996 | Murakami et al. | 134/902 |
| 5,492,138 | 2/1996 | Taricco | 134/105 |
| 5,722,441 | 3/1998 | Treamoto | 134/902 |
| 5,778,911 | 7/1998 | Yoshio | 134/902 |

FOREIGN PATENT DOCUMENTS

| | | | |
|---|---|---|---|
| 3-30329 | 2/1991 | Japan | 134/902 |
| 3-62521 | 3/1991 | Japan | 134/902 |
| 4-192419 | 7/1992 | Japan | 134/902 |
| 4-304636 | 10/1992 | Japan | 134/902 |

*Primary Examiner*—Frankie L. Stinson
*Attorney, Agent, or Firm*—Oblon, Spivak, McClelland, Maier & Neustadt, P.C.

[57]              ABSTRACT

A processing apparatus of this invention has an openable window portion for transferring a target processing substrate, and an inlet port for introducing the outer atmosphere. Further, the processing apparatus includes a closed processing chamber for performing predetermined processing for the target processing substrate transferred via the window portion, an exhaust means for evacuating the interior of the processing chamber, and an opening/closing mechanism for closing the inlet port, and opening the inlet port when the pressure in the processing chamber is negative.

18 Claims, 14 Drawing Sheets

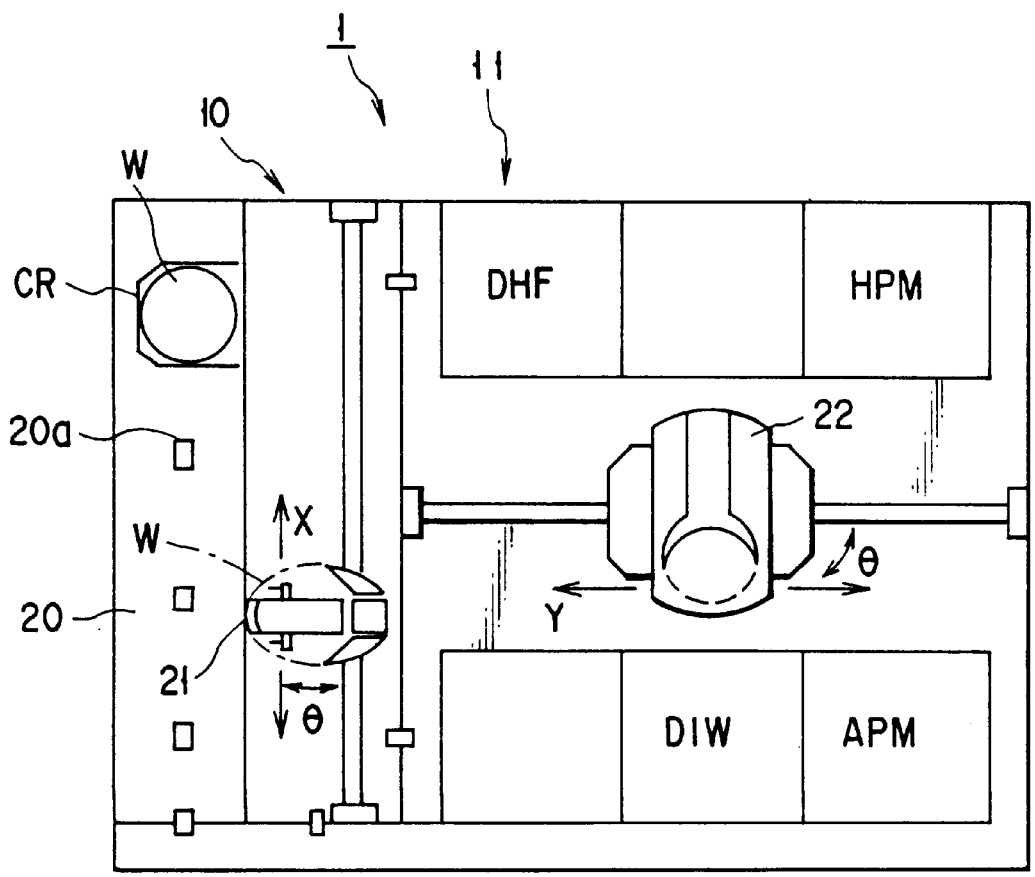
F I G. 2

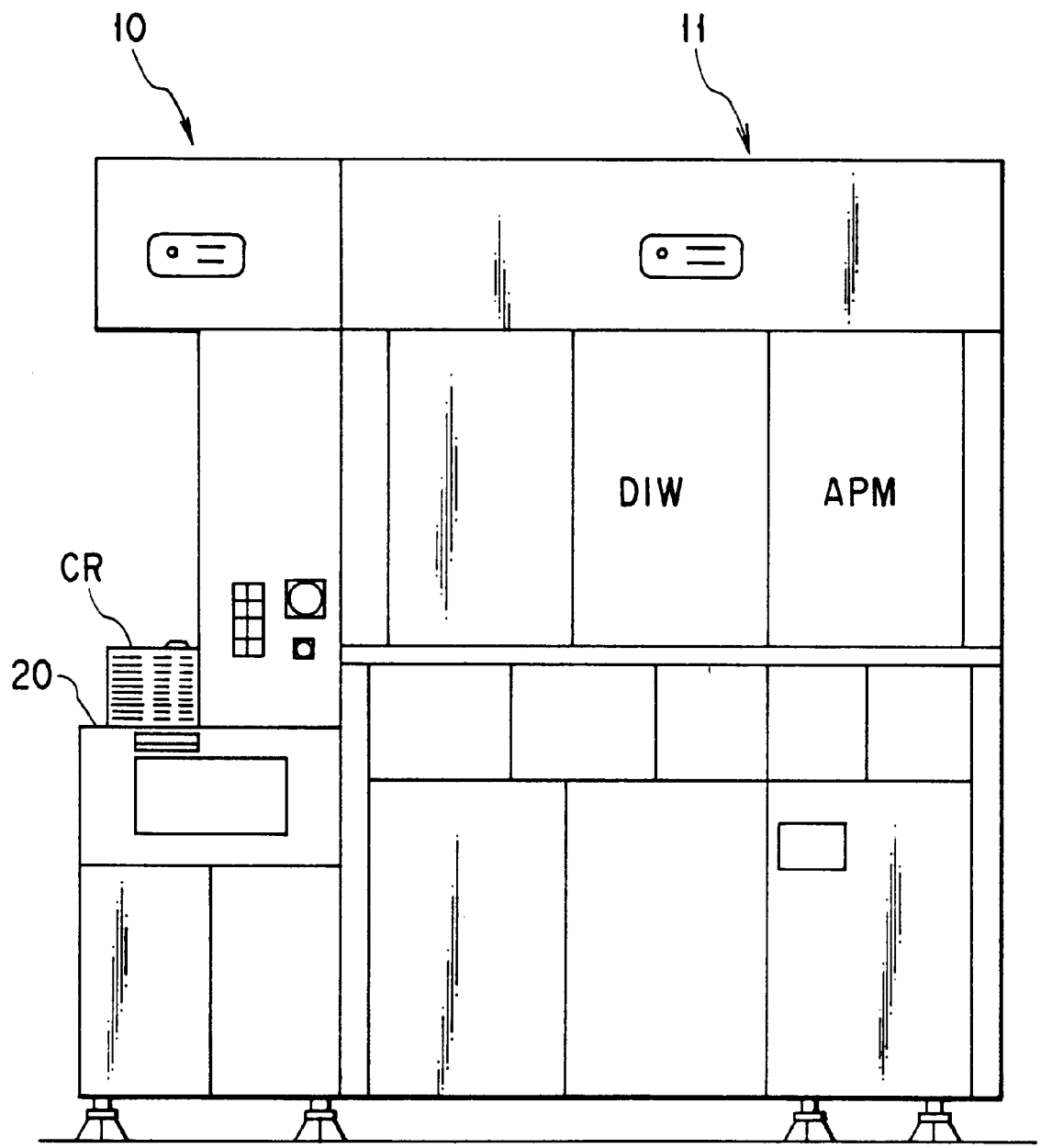
F I G. 3

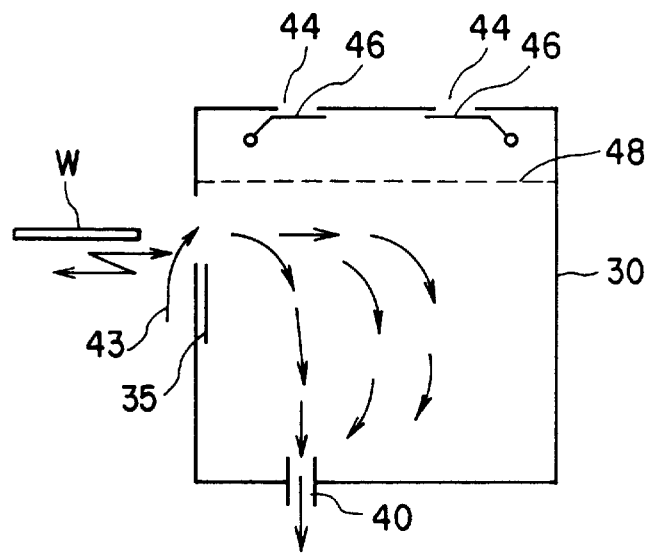
F I G. 10
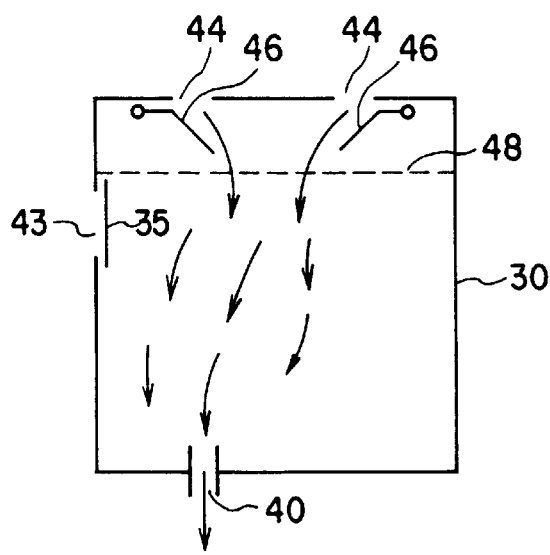
F I G. 11
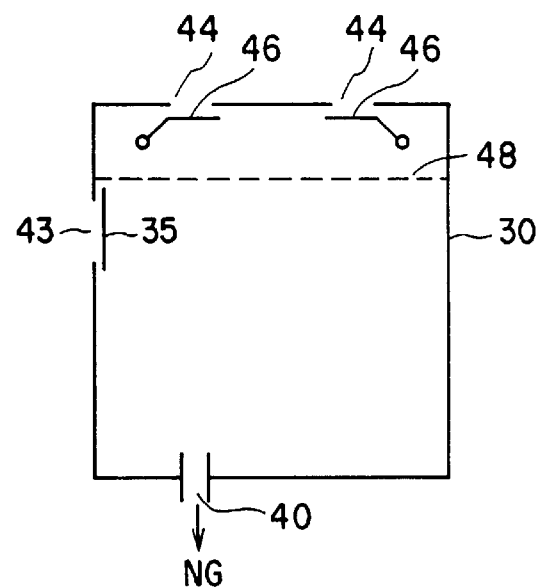
F I G. 12

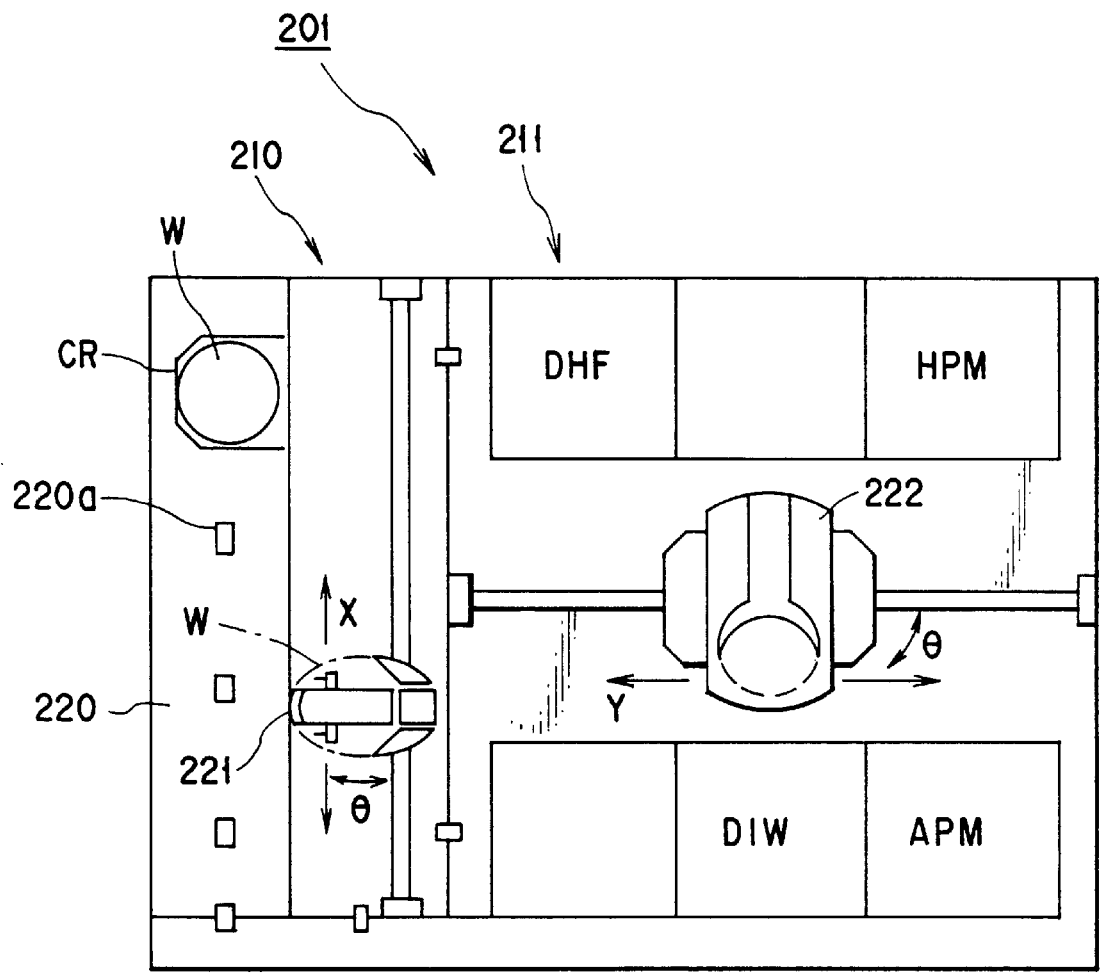
F I G. 13

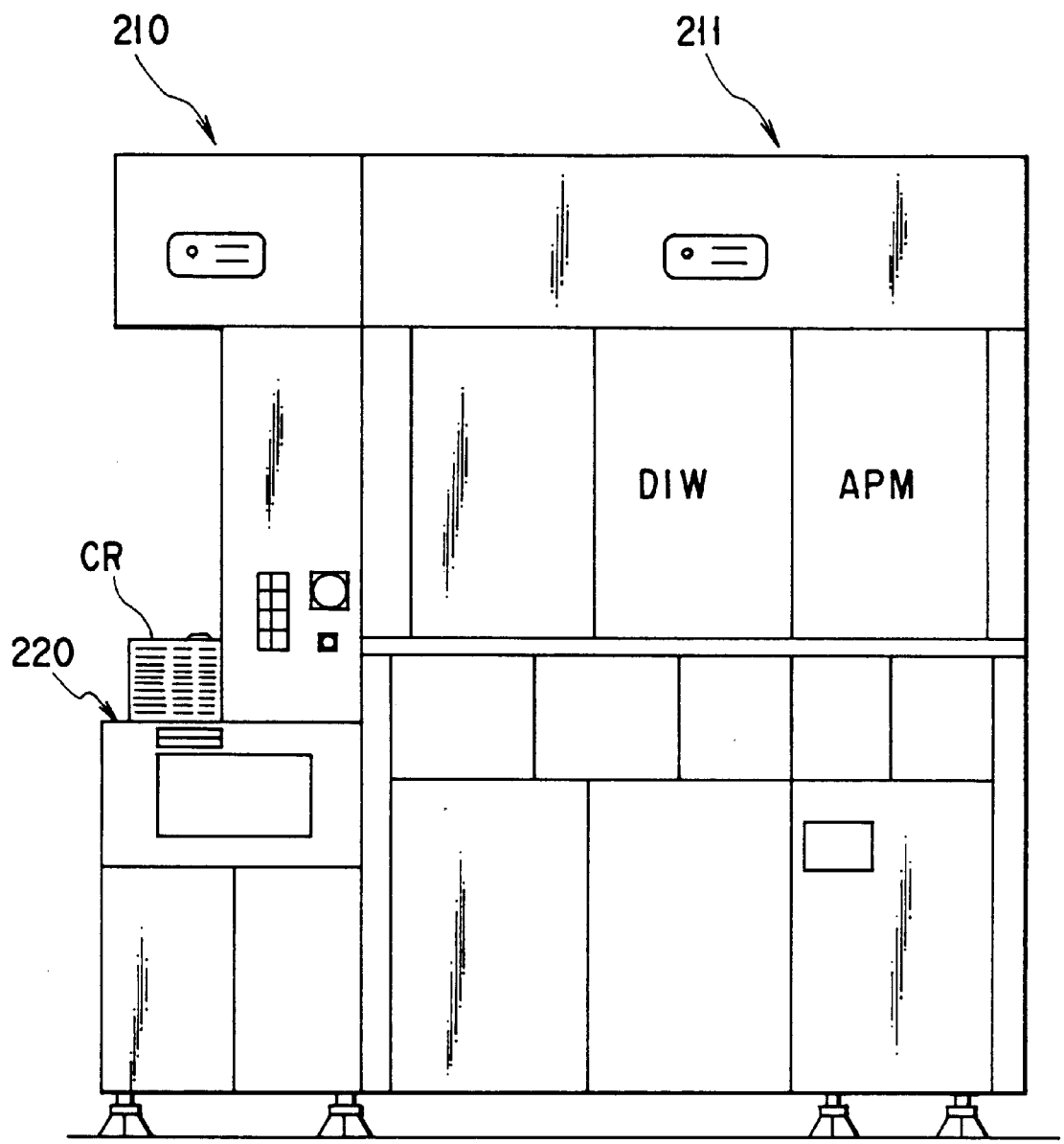
F I G. 14

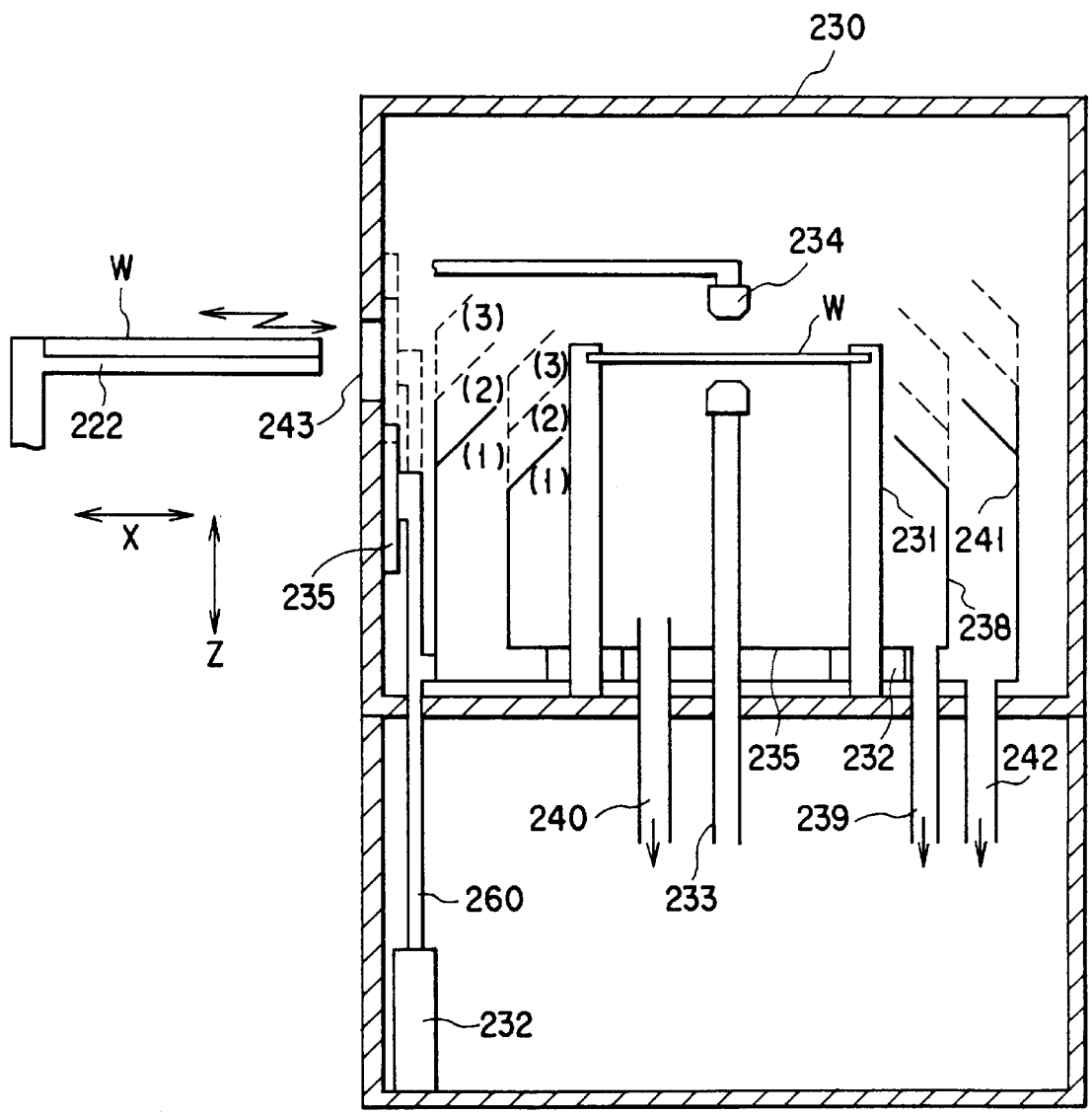
F I G. 16

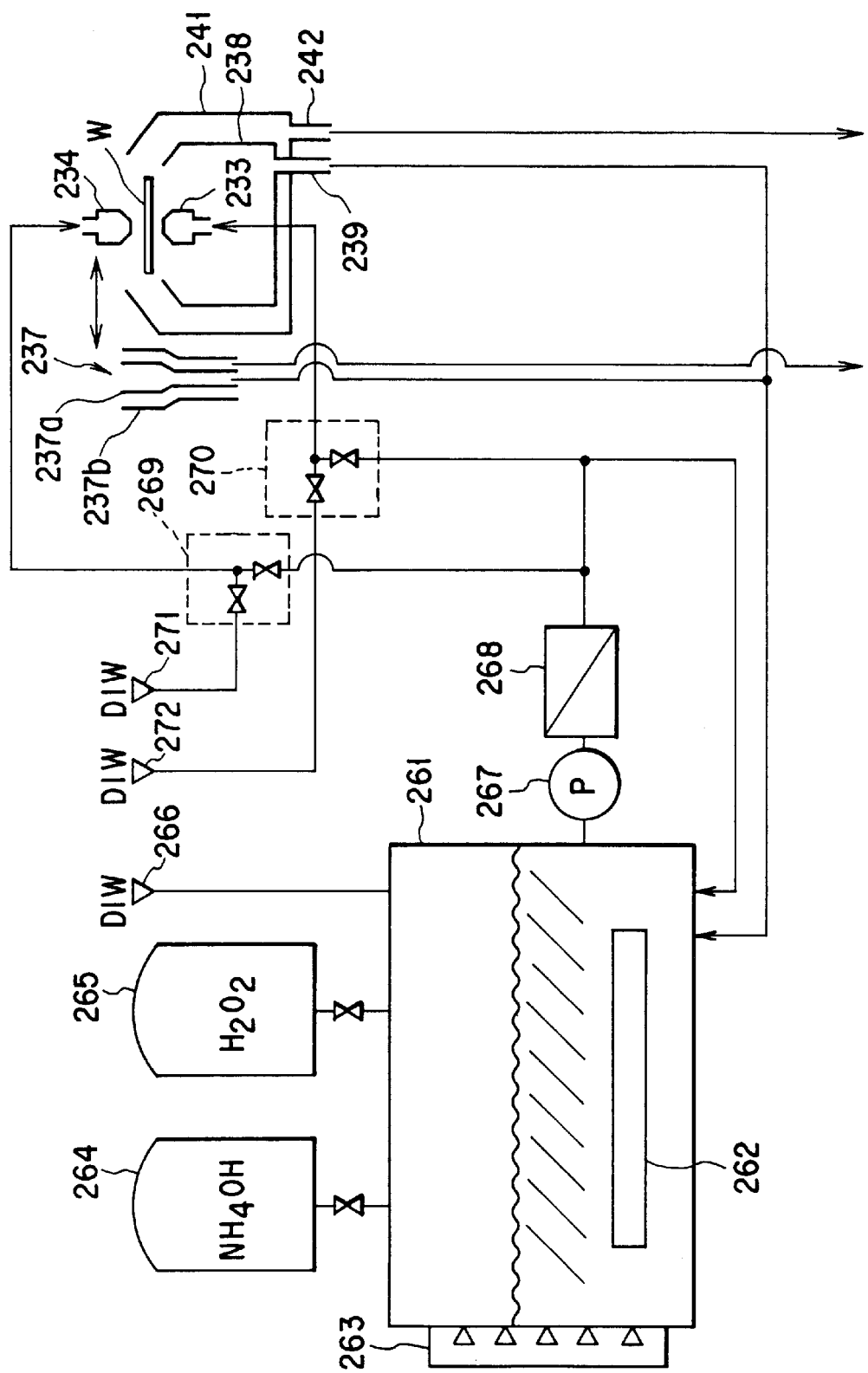
F I G. 19

PROCESSING APPARATUS FOR TARGET PROCESSING SUBSTRATE

BACKGROUND OF THE INVENTION

The present invention relates to a processing apparatus such as a wafer cleaning apparatus for cleaning, e.g., a semiconductor wafer.

In the semiconductor manufacturing process, cleaning of a semiconductor wafer (to be simply referred to as a wafer hereinafter), e.g., removal of fine particles, removal of metal contamination, removal of an oxide film, and the like must be performed. In the cleaning process to remove fine particles, liquid phase cleaning using an $NH_4/H_2O_2/H_2O$ solution mixture (to be referred to as APM hereinafter) is generally performed. In the cleaning process to remove metal contamination, liquid phase cleaning using an $HCl/H_2O_2/H_2O$ solution mixture (to be referred to as HPM hereinafter) is generally performed. In the cleaning process to remove an oxide film, liquid phase cleaning using an $HF/H_2O$ solution mixture (to be referred to as DHF hereinafter) is generally performed.

Recently, while single wafer processing of each process has been advanced along with an increase in wafer diameter, single wafer processing has also progressed in this cleaning process. For example, one wafer cleaning apparatus for single wafer processing is constituted by arranging processing chambers for performing APM cleaning, HPM cleaning, and DHM cleaning along a wafer convey path for conveying a wafer, and movably arranging, on the wafer convey path, a wafer conveyor for transferring the wafer between these processing chambers.

The respective processing chambers have almost the same arrangement. FIG. 1 shows an example of the schematic arrangement of the processing chamber.

As shown in FIG. 1, a holding member 101 for rotatably holding a wafer W, and an injection nozzle 102 for injecting a predetermined cleaning solution, e.g., the $NH_4/H_2O_2/H_2O$ solution mixture for APM cleaning, to the surface of the wafer W held and rotated by the holding member 101 are arranged in a closed processing chamber 100. An openable window portion 103 for transferring the wafer W is formed in the front surface of the processing chamber 100 on the wafer convey path side. A wafer conveyor 104 movably arranged on the wafer convey path transfers the wafer W to be cleaned via the window portion 103.

In this arrangement of the processing chamber 100, if the atmosphere in the processing chamber 100, e.g., the $NH_4$ gas for APM cleaning leaks outside the processing chamber, e.g., to the wafer convey path side, the gas adversely affects a wafer on the wafer convey path. For this reason, such leakage must be avoided. Therefore, an inlet port for introducing the outer atmosphere is formed at a predetermined position of the processing chamber 100 to evacuate the interior of the processing chamber and set the interior of the processing chamber at a negative pressure.

Even if the exhaust means is arranged in the processing chamber of the wafer cleaning apparatus in the above manner, when the window portion 103 is opened to allow transfer of the wafer W, the negative pressure set inside the processing chamber may weaken, and the atmosphere in the processing chamber may leak outside via the window portion 103. When the exhaust means fails in exhaust due to any cause, the atmosphere in the processing chamber may leak outside via the above-described inlet portion.

In this wafer cleaning apparatus, one wafer is loaded into the unit, and cleaned with a cleaning solution such as the APM, the HPM, or the DHF, and then with a rinsing solution such as deionized water (DIW). The cleaning and rinsing solutions used and the like are generally discharged as the waste.

Of such cleaning and rinsing solutions, particularly the cleaning solution is very expensive. When the above single wafer processing is not performed, a large amount of cleaning solution is consumed, resulting in a high running cost. In the single-wafer cleaning apparatus, a cleaning solution bath for storing the cleaning bath is bulky, and the space cost is high.

BRIEF SUMMARY OF THE INVENTION

It is the first object of the present invention to provide a processing apparatus in which the atmosphere inside a processing chamber does not leak outside and, more specifically, a processing apparatus in which the atmosphere inside the processing chamber does not leak outside via a window portion that allows transfer of a target processing substrate.

It is the second object of the present invention to provide a processing apparatus in which the atmosphere inside the processing chamber does not leak outside via an inlet port for introducing the outer atmosphere.

It is the third object of the present invention to provide a processing apparatus capable of realizing the above objects with a very simple structure.

It is the fourth object of the present invention to provide a processing apparatus capable of forming a down flow inside the processing chamber.

It is the fifth object of the present invention to provide a processing chamber in which dust produced near the inlet port for introducing the outer atmosphere does not attach to the target processing substrate during processing.

It is the sixth object of the present invention to provide a cleaning apparatus capable of reducing the consumption amount of cleaning solution used for cleaning, and reducing the running and space costs.

It is the seventh object of the present invention to provide a cleaning apparatus capable of recovering and recycling the cleaning solution with a simple arrangement.

It is the eighth object of the present invention to provide a cleaning apparatus capable of shortening the cleaning time and improving the throughput.

It is the ninth object of the present invention to provide a cleaning apparatus in which the target processing substrate is free from any adverse effect of the cleaning solution.

It is the 10th object of the present invention to provide a cleaning apparatus capable of efficiently recovering and recycling the cleaning solution.

It is the 11th object of the present invention to provide a cleaning apparatus capable of more satisfactorily performing cleaning and, more specifically, a cleaning apparatus in which, e.g., the cleaning solution does not adversely affect the target processing substrate, and no watermark or the like attaches thereto.

It is the 12th object of the present invention to provide a cleaning apparatus capable of further reducing the consumption amount of cleaning solution used for cleaning and, more particularly, a cleaning apparatus capable of further reducing the consumption amount of cleaning solution with a simpler structure without increasing the size of the apparatus.

To achieve the above objects, a processing apparatus according to the present invention comprises a closed processing chamber having an openable window portion for transferring a target processing substrate and an inlet port for introducing an outer atmosphere, the closed processing chamber performing predetermined processing for the target processing substrate transferred via the window portion, exhaust means for evacuating an interior of the processing chamber, and an opening/closing mechanism for closing the inlet port, and opening the inlet port when a pressure in the processing chamber is negative.

In the present invention, when the pressure in the processing chamber is negative, the opening/closing mechanism opens the inlet port. For example, when the window portion is closed, the interior of the processing chamber can be evacuated by the exhaust means while the outer atmosphere is introduced from the inlet port. When the pressure in the processing chamber is not negative, e.g., when the window portion is opened to allow transfer of the target processing substrate, or when the interior of the processing chamber cannot be evacuated by the exhaust means due to any cause, the opening/closing mechanism closes the inlet port. With this arrangement, the atmosphere in the processing chamber does not leak outside from the window portion or the inlet port.

Another processing apparatus according to the present invention comprises a closed processing chamber having an openable window portion for transferring a target processing substrate and an inlet port for introducing an outer atmosphere, the closed processing chamber performing predetermined processing for the target processing substrate transferred via the window portion, exhaust means for evacuating an interior of the processing chamber, and an opening/closing mechanism having an opening/closing plate axially supported to open/close the inlet port, and a counterweight which balances the opening/closing plate so as to cause the opening/closing plate to close the inlet port, and open the inlet port when the pressure in the processing chamber is negative.

In the present invention, the opening/closing plate is opened/closed by the counterweight which balances the opening/closing plate so as to cause the opening/closing plate to close the inlet port, and open the inlet port when the pressure in the processing chamber is negative. With this arrangement, the atmosphere in the processing chamber can be prevented from leaking outside with a very simple structure.

Still another processing apparatus according to the present invention comprises a closed processing chamber having a front surface with an openable window portion for transferring a target processing substrate and an upper surface with an inlet port for introducing an outer atmosphere, the closed processing chamber performing predetermined processing for the target processing substrate transferred via the window portion, exhaust means, arranged below in the processing chamber, for evacuating an interior of the processing chamber, and an opening/closing mechanism having an opening/closing plate axially supported to open/close the inlet port, and a counterweight which balances the opening/closing plate so as to cause the opening/closing plate to close the inlet port, and open the inlet port when a pressure in the processing chamber is negative.

In the present invention, in addition to the above arrangement, the inlet port for introducing the outer atmosphere, and its opening/closing mechanism are arranged on the upper surface of the processing chamber, and the exhaust means is arranged below in the processing chamber. Therefore, a down flow can be formed in the processing chamber.

Still another processing apparatus according to the present invention comprises a closed processing chamber having a front surface with an openable window portion for transferring a target processing substrate, and an upper surface with an inlet port for introducing an outer atmosphere, the closed processing chamber performing predetermined processing for the target processing substrate transferred via the window portion, exhaust means, arranged below in the processing chamber, for evacuating an interior of the processing chamber, an opening/closing mechanism having an opening/closing plate axially supported to open/close the inlet port, and a counterweight which balances the opening/closing plate so as to cause the opening/closing plate to close the inlet port, and open the inlet port when a pressure in the processing chamber is negative, and a partition plate which is arranged in the processing chamber, separates a processing portion for performing predetermined processing for the target processing substrate from the inlet port thereabove, and has a vent hole.

In the present invention, since the partition plate which separates the processing portion for performing predetermined processing for the target processing substrate from the inlet port thereabove is arranged in the processing chamber, dust produced near the inlet port for introducing the outer atmosphere does not attach to the target processing substrate during processing. The vent hole is preferably formed in the partition plate in a region except for the region immediately below the inlet port. With this arrangement, the dust on the inlet port side can be prevented from falling to the processing portion via the vent hole.

Still another cleaning apparatus according to the present invention comprises cleaning means for cleaning a target processing substrate with cleaning and rising solutions, a circulation system for circulating the cleaning solution used by the cleaning means, and recycling the cleaning solution in the cleaning means, and a discharge system for discharging the rinsing solution used by the cleaning means.

In the present invention, the cleaning solution used for cleaning is circulated and recycled. With this arrangement, the consumption amount of cleaning solution used for cleaning can be decreased to reduce the running and space costs.

Still another cleaning apparatus according to the present invention comprises an accommodation portion having a double cup structure in which opening portions allowing loading/unloading of a target processing substrate are formed, and the opening portion of an inner cup is at a lower level than that of an outer cup, a rotation/transfer portion for holding and rotating the target processing substrate within the accommodation portion, and transferring the substrate between the inner and outer cups, an injection portion for injecting one of the cleaning and rinsing solutions to the target processing substrate rotated within the inner and outer cups by the rotation/transfer portion, a circulation system for circulating the cleaning solution recovered by one of the inner and outer cups, and recycling the cleaning solution at the injection portion, and a discharge system for discharging the rinsing solution recovered by the other of the inner and outer cups.

In the present invention, a liquid injected to the target processing substrate transferred to the inner cup is recovered by the inner cup. A liquid injected to the target processing substrate transferred to the outer cup, i.e., between the opening portions of the outer and inner cups scatters between the opening portions by a centrifugal force, and is recovered by the outer cup. The cleaning solution recovered by one of the inner and outer cups is circulated and recycled. Accordingly, the cleaning solution can be recovered and recycled with a simple arrangement.

Still another cleaning apparatus according to the present invention comprises an accommodation portion having a double cup structure in which opening portions allowing loading/unloading of a target processing substrate are formed, and the opening portion of an inner cup is at a lower level than that of an outer cup, a rotation/transfer portion for holding and rotating the target processing substrate within the accommodation portion, and transferring the substrate between the inner and outer cups, an injection portion for injecting one of the cleaning and rinsing solutions to upper and lower surfaces of the target processing substrate rotated within the inner and outer cups by the rotation/transfer portion, a circulation system for circulating the cleaning solution recovered by one of the inner and outer cups, and recycling it at the injection portion, and a discharge system for discharging the rinsing solution recovered by the other of the inner and outer cups.

In the present invention, the cleaning and rinsing solutions are particularly injected to the upper and lower surfaces of the target processing substrate to clean them. With this arrangement, the cleaning time can be shortened to improve the throughput.

Still another cleaning apparatus according to the present invention comprises an accommodation portion having a double cup structure in which opening portions allowing loading/unloading of a target processing substrate are formed, and the opening portion of an inner cup is at a lower level than that of an outer cup, a rotation/transfer portion for holding and rotating the target processing substrate within the accommodation portion, and transferring the substrate between the inner and outer cups, an injection portion for injecting the cleaning solution to upper and lower surfaces of the target processing substrate rotated within the inner cup by the rotation/transfer portion, and injecting the rinsing solution to the upper and lower surfaces of the target processing substrate rotated within the outer cup by the rotation/transfer portion, a circulation system for circulating the cleaning solution recovered by the inner cup, and recycling it at the injection portion, and a discharge system for discharging the rinsing solution recovered by the outer cup.

In the present invention, particularly, the cleaning solution is injected within the inner cup, while the rinsing solution is injected within the outer cup. With this arrangement, the atmosphere along with the cleaning solution does not influence the target processing substrate cleaned with the rinsing solution. The cleaning solution does not adversely affect the target processing substrate.

Still another cleaning apparatus according to the present invention comprises an accommodation portion having a double cup structure in which opening portions allowing loading/unloading of a target processing substrate are formed, and the opening portion of an inner cup is at a lower level than that of an outer cup, a rotation/transfer portion for holding and rotating the target processing substrate within the accommodation portion, and transferring the substrate between the inner and outer cups, an injection portion for injecting the cleaning solution to upper and lower surfaces of the target processing substrate rotated within the outer cup by the rotation/transfer portion, and injecting the rinsing solution to the upper and lower surfaces of the target processing substrate rotated within the inner cup by the rotation/transfer portion, a circulation system for circulating the cleaning solution recovered by the outer cup, and recycling it at the injection portion, and a discharge system for discharging the rinsing solution recovered by the inner cup.

In the present invention, particularly, the rinsing solution is injected within the inner cup, while the cleaning solution is injected within the outer cup. With this arrangement, the cleaning solution can be more efficiently recovered.

Still another cleaning apparatus according to the present invention comprises an injection portion for alternately injecting cleaning and rinsing solutions to a target processing substrate by using a single injection nozzle, and means for discharging the cleaning and rinsing solutions from the injection nozzle for a predetermined period before the injection portion injects the cleaning and rinsing solutions to the target processing substrate.

In the present invention, the cleaning and rinsing solutions are discharged from the injection nozzle for the predetermined period before the injection nozzle injects the cleaning and rinsing solutions to the target processing substrate. With this arrangement, when the cleaning solution is injected to the target processing substrate, no rinsing solution remaining in the injection nozzle is injected to the target processing substrate. When the rinsing solution is injected to the target processing substrate, no cleaning solution remaining in the injection nozzle is injected to the target processing substrate. Therefore, the cleaning solution does not adversely affect the target processing substrate, and no watermark or the like attaches thereto. Cleaning can be more satisfactorily performed.

Still another cleaning apparatus according to the present invention comprises an injection portion for alternately injecting cleaning and rinsing solutions to a target processing substrate by using a single injection nozzle, means for discharging the cleaning and rinsing solutions from the injection nozzle for a predetermined period before the injection portion injects the cleaning and rinsing solutions to the target processing substrate, and a circulation system for recovering and circulating, of the cleaning and rinsing solutions discharged from the injection nozzle, the cleaning solution, and recycling the cleaning solution at the injection portion.

In the present invention, of the cleaning and rinsing solutions discharged from the injection nozzle, the cleaning solution is particularly recovered and circulated. With this arrangement, the consumption amount of cleaning solution can be further reduced.

Still another cleaning apparatus according to the present invention comprises an injection portion for alternately injecting cleaning and rinsing solutions to a target processing substrate by using a single injection nozzle, a cleaning solution recovery portion for recovering the cleaning solution injected from the injection nozzle, a rinsing solution recovery portion for recovering the rinsing solution injected from the injection nozzle, means for discharging the cleaning solution to the cleaning solution recovery portion from the injection nozzle for a predetermined period before the injection portion injects the cleaning solution to the target processing substrate, and discharging the rinsing solution to the rinsing solution recovery portion from the injection nozzle for a predetermined period before the injection portion injects the rinsing solution to the target processing substrate, and a circulation system for circulating the cleaning solution recovered by the cleaning solution recovery portion, and recycling the cleaning solution at the injection portion.

In the present invention, the cleaning solution recovery portion for recovering the cleaning solution injected from the injection nozzle, and the rinsing solution recovery portion for recovering the rinsing solution injected from the injection nozzle are separately arranged. Therefore, the cleaning solution can be easily recovered.

Still another cleaning apparatus according to the present invention comprises an injection portion for alternately injecting cleaning and rinsing solutions to a target processing substrate by using a single injection nozzle, a cleaning solution recovery portion which is arranged adjacent to the injection portion, and recovers the cleaning solution injected from the injection nozzle, a rinsing solution recovery portion which is arranged adjacent to the injection portion and recovers the rinsing solution injected from the injection nozzle, nozzle moving means for moving the injection nozzle between the injection portion, the cleaning solution recovery portion, and the rinsing solution recovery portion, means for causing the nozzle moving means to move the injection nozzle to the cleaning solution recovery portion to discharge the cleaning solution to the cleaning solution recovery portion from the injection nozzle for a predetermined period before the injection portion injects the cleaning solution to the target processing substrate, and causing the nozzle moving means to move the injection nozzle to the rinsing solution recovery portion to discharge the rinsing solution to the rinsing solution recovery portion from the injection nozzle for a predetermined period before the injection portion injects the rinsing solution to the target processing substrate, and a circulation system for circulating the cleaning solution recovered by the cleaning solution recovery portion, and recycling the cleaning solution at the injection portion.

In the present invention, the cleaning solution recovery portion and the rinsing solution recovery portion are particularly arranged adjacent to the injection portion. When the cleaning solution must be discharged, the injection nozzle is transferred to the cleaning solution recovery portion and the rinsing solution recovery portion. Accordingly, the consumption amount of cleaning solution can be reduced with a simpler structure without increasing the size of the apparatus.

Still another cleaning apparatus according to the present invention comprises an injection portion for alternately injecting cleaning and rinsing solutions to a target processing substrate by using a single injection nozzle, a recovery portion with a double cup structure which is arranged adjacent to the injection portion, and has an inner cup for recovering one of the cleaning and rinsing solutions injected from the injection nozzle, and an outer cup for recovering the other, nozzle moving means for moving the injection nozzle between the injection portion and the recovery portion, means for causing the nozzle moving means to move the injection nozzle to one of the cups to discharge the cleaning solution from the injection nozzle for a predetermined period before the injection portion injects the cleaning solution to the target processing substrate, and causing the nozzle moving means to move the injection nozzle to the other cup to discharge the rinsing solution from the injection nozzle for a predetermined period before the injection portion injects the rising solution to the target processing substrate, and a circulation system for circulating, of the cleaning solutions recovered by the recovery portion, the cleaning solution, and recycling the cleaning solution at the injection portion.

In the present invention, the recovery portion has the double cup structure with the inner cup for recovering one of the cleaning and rinsing solutions injected from the injection nozzle, and the outer cup for recovering the other. The apparatus can be further downsized.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view of the overall arrangement of a semiconductor wafer cleaning apparatus in which an embodiment of the present invention is employed;

FIG. 3 is a front view of the cleaning apparatus shown in FIG. 2;

FIG. 10 is a view showing an example of an opening/closing operation by the opening/closing mechanism in this embodiment;

FIG. 11 is a view showing the example of an opening/closing operation by the opening/closing mechanism in this embodiment;

FIG. 12 is a view showing the example of an opening/closing operation by the opening/closing mechanism in this embodiment;

FIG. 13 is a plan view of the overall arrangement of a semiconductor wafer cleaning apparatus in which another embodiment of the present invention is employed;

FIG. 14 is a front view of the cleaning apparatus shown in FIG. 13;

FIG. 16 is a longitudinal sectional view of a cleaning unit shown in FIG. 13;

FIG. 19 is a view showing the arrangements of circulation and discharge systems for a cleaning solution and DIW in the cleaning apparatus shown in FIG. 13.

DETAILED DESCRIPTION OF THE INVENTION

Figure 1:
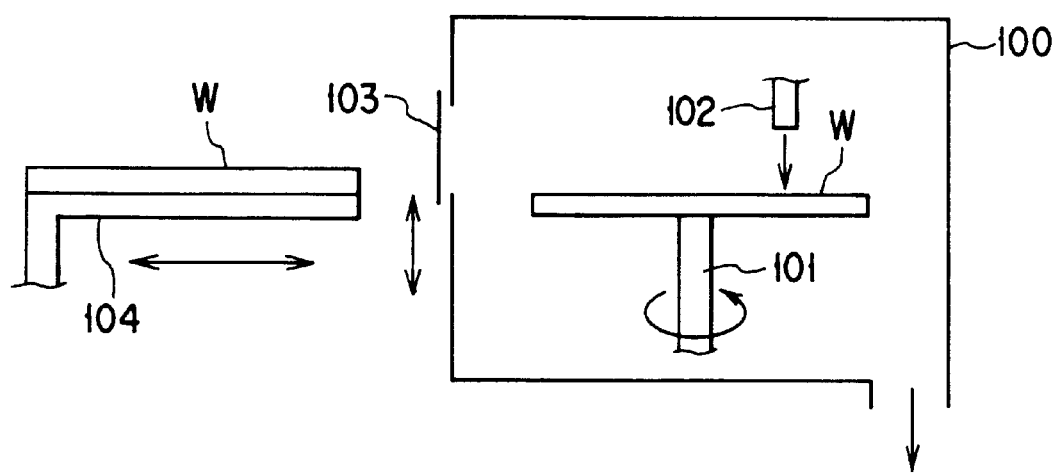
FIG. 1 is a view showing the schematic arrangement of a conventional processing chamber.
Figure 4:
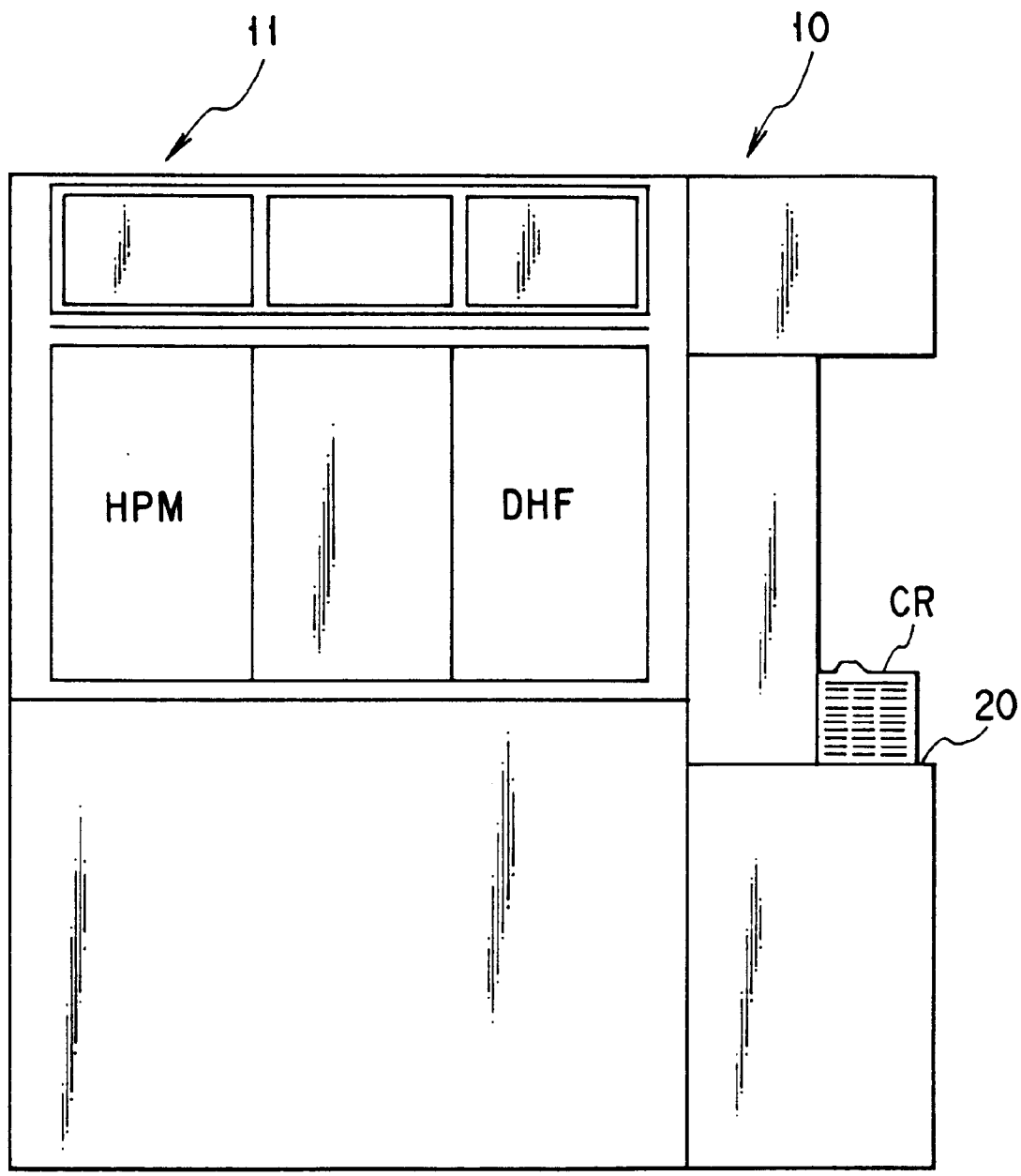
FIG. 4 is a rear view of the cleaning apparatus shown in FIG. 2.

An embodiment of the present invention will be described with reference to the several views of the accompanying drawing. FIGS. 2 to 4 are views, respectively show the overall arrangement of a wafer cleaning apparatus 1 for a semiconductor wafer (to be referred to as a "wafer" hereinafter) in which an embodiment of the present invention is employed.

The wafer cleaning apparatus 1 is constituted by integrally connecting a cassette station 10 for externally loading wafers W as target processing substrates into a system in units of a plurality of, e.g., 25 wafers for a wafer cassette CR, unloading them from the system, and loading/unloading the wafers W in/from the wafer cassette CR, and a cleaning station 11 in which various single-wafer cleaning units each for performing predetermined cleaning for the wafers W one by one are arranged at predetermined positions.

In the cassette station 10, as shown in FIG. 2, a plurality of, e.g., up to four wafer cassettes CR are mounted at the positions of alignment projections 20a on a cassette table 20 in a line along the X direction (vertical direction in FIG. 2) while directing their wafer entrances to the cleaning station 11 side. A wafer conveyor 21 movable in this cassette alignment direction (X direction) and the wafer alignment direction (Z direction; vertical direction) of the wafers stored in the wafer cassette CR selectively accesses the respective wafer cassettes CR. The wafer conveyor 21 is constituted to be rotatable in the θ direction, and can also access a wafer conveyor 22 on the cleaning station 11 side, as will be described later.

As shown in FIG. 2, the wafer conveyor 22 is arranged in the cleaning station 11. The wafer conveyor 22 is movable along the wafer convey path (Y direction). The cleaning units are arranged on the two sides of the convey path of the wafer conveyor 22. The wafer conveyor 22 of the cleaning station 11 is constituted to be rotatable also in the θ direction, and can access the respective cleaning units in addition to the above-described wafer conveyor 21 on the cassette station 10 side.

As shown in FIG. 2, e.g., four cleaning units are arranged on the two sides of the convey path of the wafer conveyor 22. A DIW cleaning unit for simply performing cleaning with deionized water (DIW), and an APM cleaning unit for performing cleaning using the APM are arranged on the front side of the apparatus, while a DHF cleaning unit using the DHF, and an HPM cleaning unit for performing cleaning using the HPM are arranged on the back side of the apparatus. At the remaining positions, these units or other units can be arranged.

Figure 5:
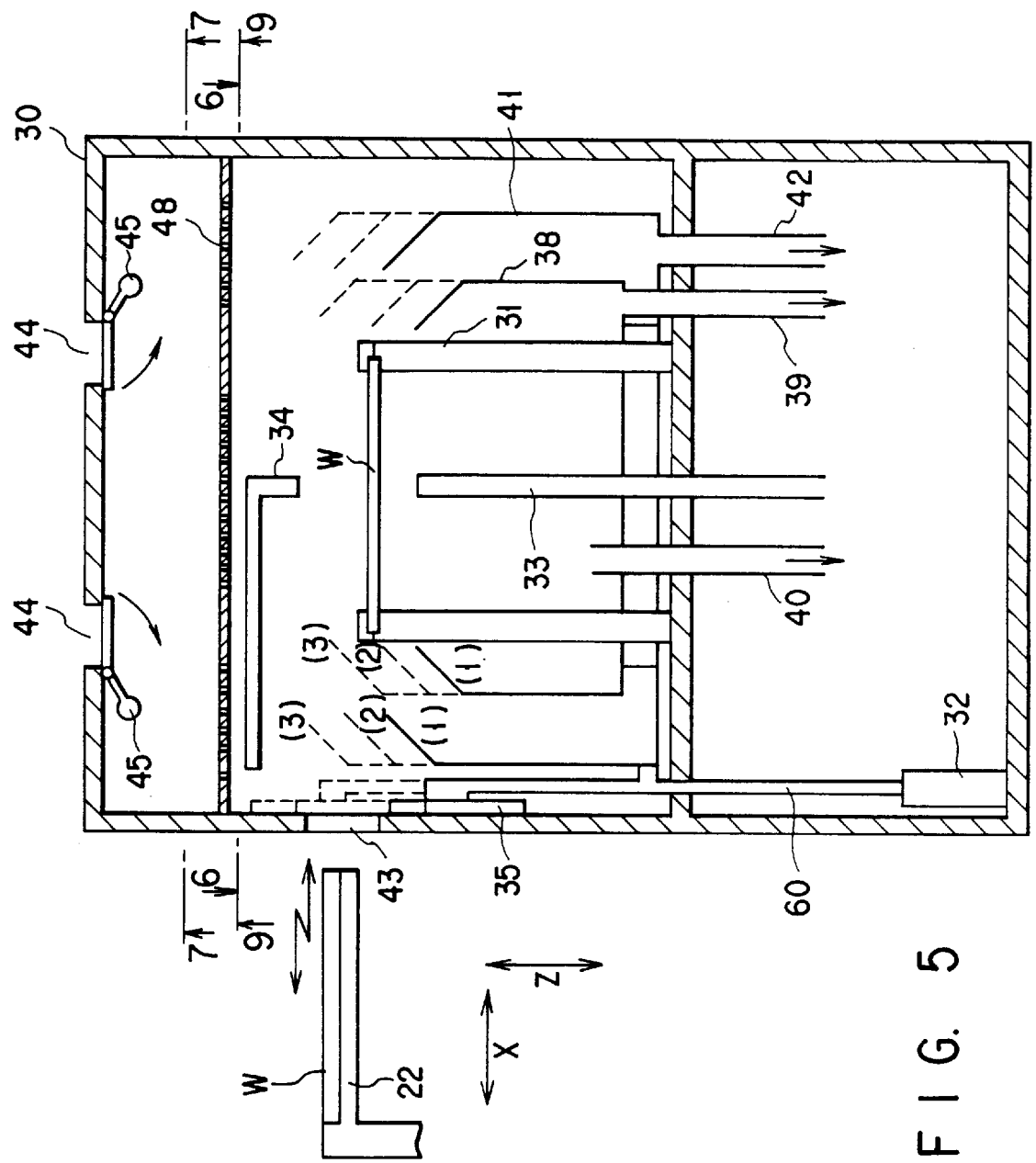
FIG. 5 is a longitudinal sectional view of a cleaning unit shown in FIG. 2.

FIG. 5 shows the arrangement of each cleaning unit. The APM, DHF, and HPF cleaning units basically have the same arrangement, as shown in FIG. 5.

As shown in FIG. 5, a chuck mechanism 31 for supporting the peripheral edge portion of the wafer W to rotate the wafer W is arranged below at almost the center in a closed processing chamber 30. Injection nozzles 33 and 34 for injecting a cleaning solution and the DIW as a rinsing solution to the wafer W are respectively arranged below and above the wafer W supported by the chuck mechanism 31. The injection nozzles 33 and 34 are respectively connected to solution and DIW tanks (neither are shown), from which the solution and the DIW are supplied.

Figure 6:
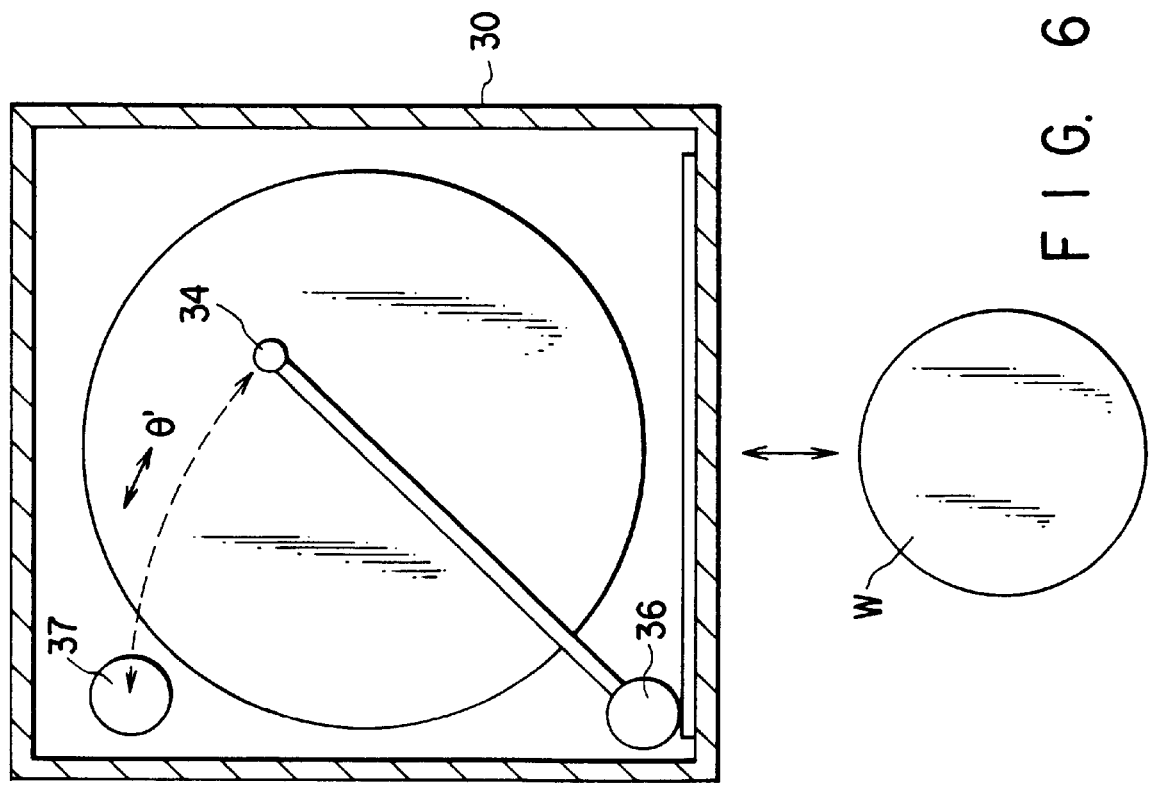
FIG. 6 is a view of the cleaning unit shown in FIG. 5 along the line 6—6.

As shown in FIG. 6, the injection nozzle 34 arranged above the wafer W is moved up and down within a predetermined range by a driving cylinder 36. The injection nozzle 34 can be rotated by a rotation driving mechanism (not shown) in the horizontal direction (θ' direction). With this arrangement, the injection nozzle 34 can be pivoted to a position falling outside the peripheral portion of the wafer W. A dummy dispenser 37 for recovering the solution injected from the injection nozzle 34 is arranged at a predetermined position falling outside the peripheral portion of the wafer W.

The chuck mechanism 31, the injection nozzle 33, and the like are accommodated in a first cup 38 having a small diameter. The first cup 38 has an upper opening portion having a diameter slightly larger than the diameter of the wafer W. The wafer W is accommodated downward in the cup via the opening portion. A first drain 39 for recovering and discharging the solution and the DIW injected within the cup is arranged in the lower surface of the first cup 38. An exhaust port 40 serving as an exhaust means for evacuating the interior of the processing chamber 30 is formed in the lower surface of the first cup 38. The exhaust port 40 is connected to, e.g., an exhaust pump (not shown).

The first cup 38 is accommodated in a second cup 41 having a diameter larger than that of the first cup 38. The second cup 41 has an upper opening portion having a diameter larger than that of the first cup 38. The wafer W is accommodated in the second and first cups via this opening portion. The opening portion of the second cup 41 is at a slightly higher level than the first cup 38. The solution and the DIW are recovered in the second cup 41 via an gap utilizing this height difference. A second drain 42 for recovering and discharging the solution and the DIW injected within the cup is arranged in the lower surface of the second cup 41. Note that an exhaust port similar to that of the first cup 38 may be formed in the second cup 41. In this embodiment, the exhaust port 40 formed in the first cup 38 is used to evacuate the interior of the processing chamber 30. The first and second cups 38 and 41 are arranged with a predetermined relationship, as described above.

A window portion 43 for transferring the wafer W is formed in the front surface of the processing chamber 30 on the wafer convey path side. The window portion 43 can be opened, e.g., vertically by the cylinder 32. The wafer conveyor 22 movably arranged on the wafer convey path transfers the wafer W to be cleaned to the processing chamber 30 via the window portion 43.

A door 35 of the window portion 43 is coupled to a cylinder 32 by a coupling member 60, and can be vertically moved on the basis of the operation of the cylinder 32. The first and second cups 38 and 41 are coupled integrally. The second cup 41 is also coupled to the coupling member 60. Therefore, the first and second cups 38 and 41 are vertically movable in synchronism with the vertical motion of the door 35 of the window portion 43, while maintaining their positional relationship.

When the opening portion of the second cup 41 is located at first, lowest position (1), the chuck mechanism 31 receives the wafer W from the wafer conveyor 22 via the window portion 43. The first and second cups 38 and 41 are moved up to locate the wafer W at second position (2) at the gap between their opening portions. Then, the wafer W is cleaned with, e.g., the DIW. The first and second cups 38 and 41 are further moved up to locate the wafer at position (3) below the opening portion of the first cup 38. Then, the wafer W is cleaned with, e.g., a solution.

Inlet ports 44 for introducing the outer atmosphere to the processing chamber 30 are formed at two portions in the upper surface of the processing chamber 30. Opening/closing mechanisms 45 each for opening/closing a corresponding inlet port 44 are arranged at the inlet ports 44.

Figure 7:
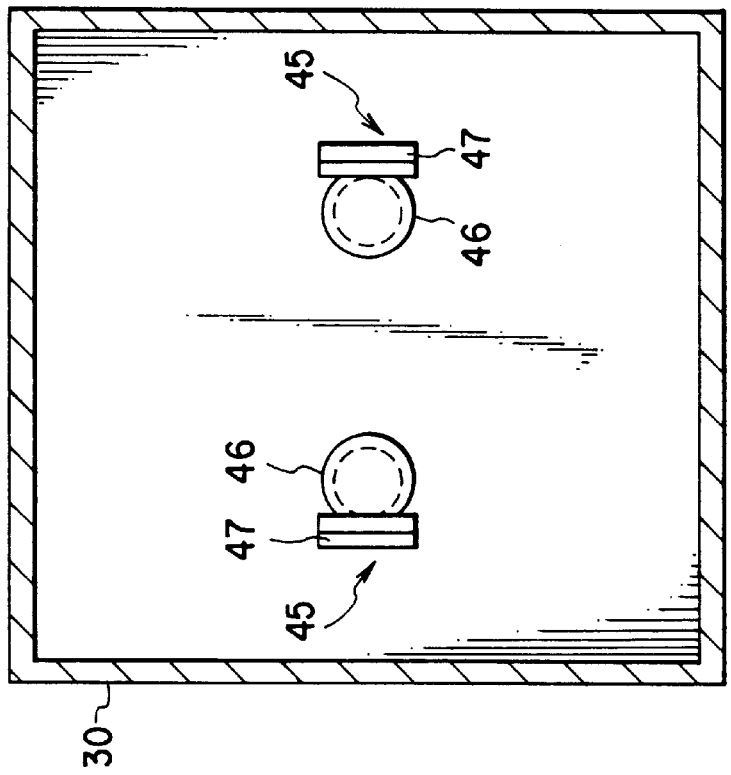
FIG. 7 is a view of the cleaning unit shown in FIG. 5 along the line 7—7.
Figure 8:
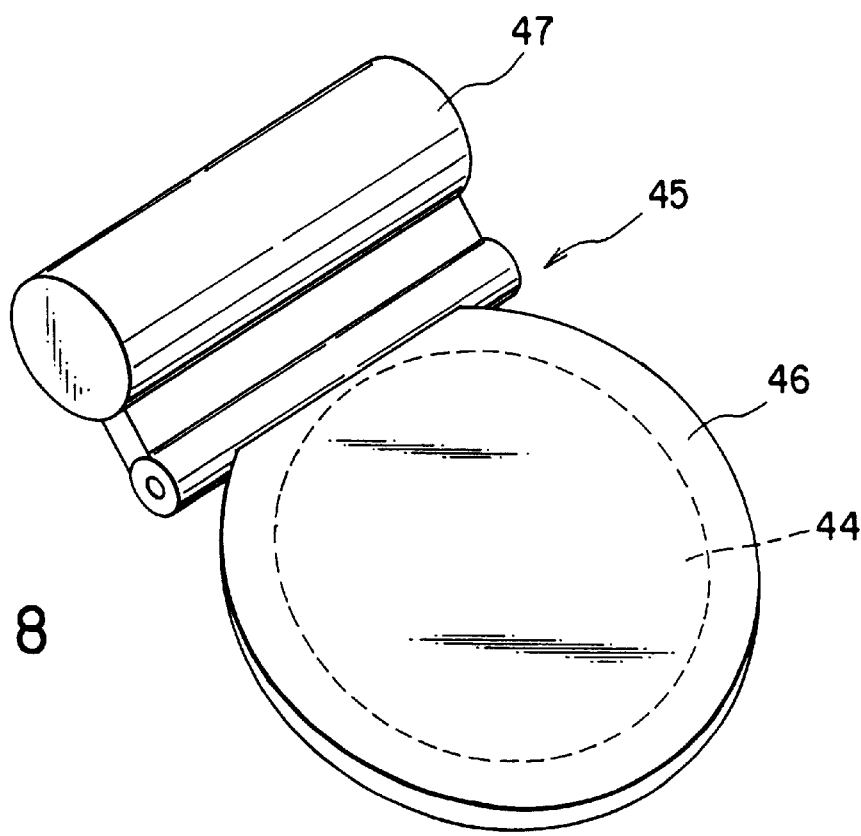
FIG. 8 is an enlarged perspective view of an opening/closing mechanism shown in FIG. 7.

FIGS. 7 and 8 show an example of the arrangement of the opening/closing mechanism 45. FIG. 7 is a view taken along the line 7—7, and FIG. 8 is an enlarged perspective view of the opening/closing mechanism 45.

As shown in FIGS. 7 and 8, each opening/closing mechanism 45 has an opening/closing plate 46 axially supported so as to open/close the inlet port 44, and a counterweight 47 which balances the opening/closing plate 46 so as to cause the opening/closing plate 46 to close the inlet port 44 when the pressures inside and outside the processing chamber 30 are almost equal, or the pressure in the processing chamber 30 is positive, and to open the inlet port 44 when the pressure in the processing chamber 30 is negative.

Figure 9:
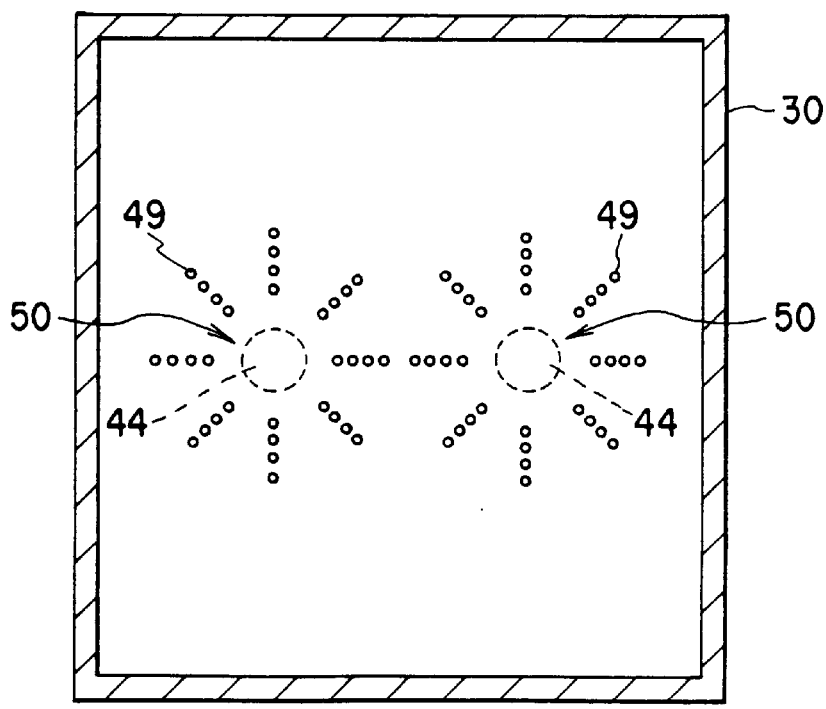
FIG. 9 is a view of the cleaning unit shown in FIG. 5 along the line 9—9.
Figure 15:
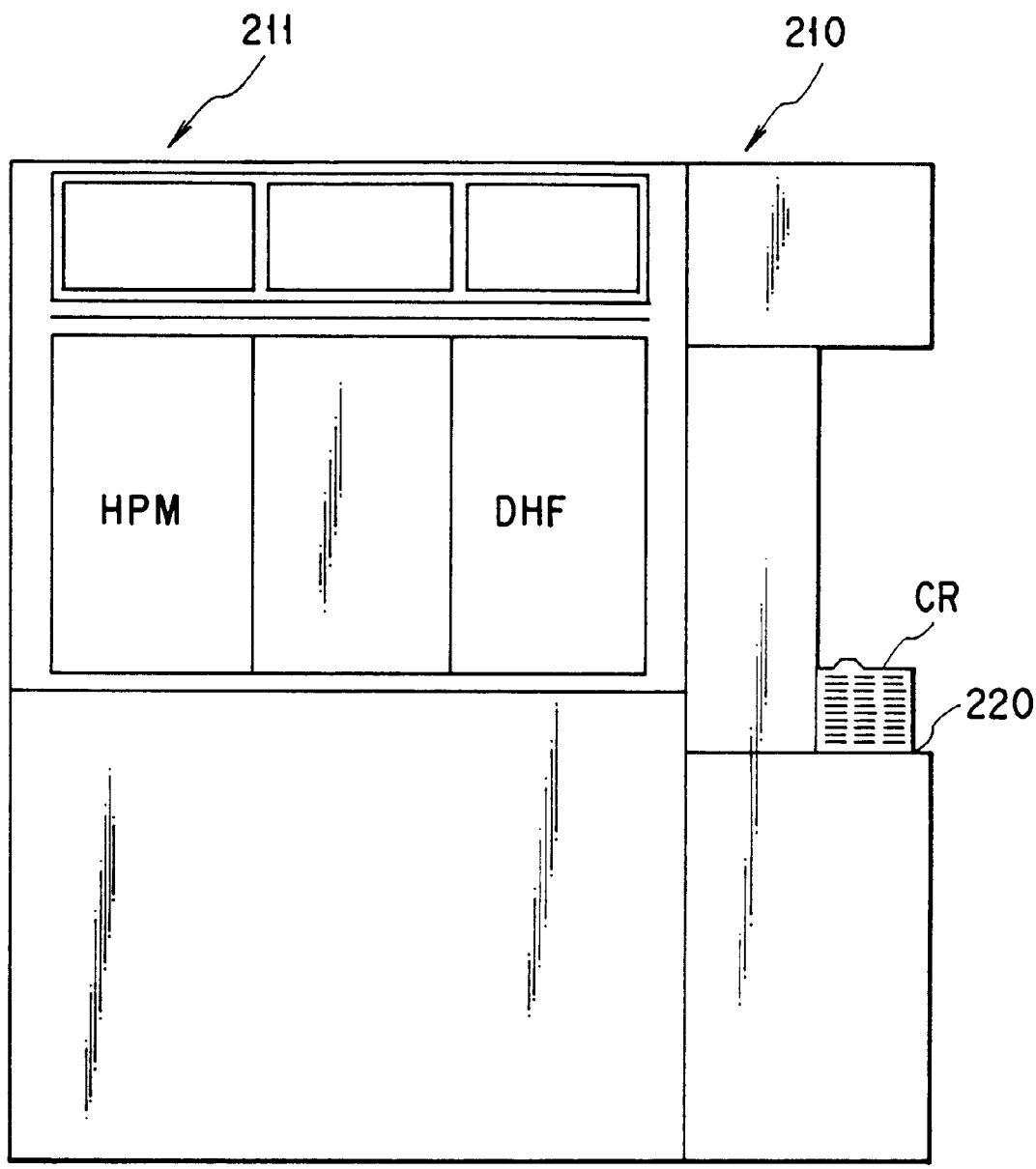
FIG. 15 is a rear view of the cleaning apparatus shown in FIG. 13.

As shown in FIG. 5, a partition plate 48 separating a processing portion which is arranged below in the processing chamber 30 and has the first and second cups 38 and 41 and the like from the inlet ports 44 arranged thereabove is arranged in the processing chamber 30. A plurality of vent holes 49 are formed, e.g., radially in the partition plate 48, as shown in FIG. 9. These vent holes 49 are formed in a region except for regions 50 immediately below the inlet ports 44. With this arrangement, refuse from the inlet port 44 can be prevented from falling to the processing portion having the first and second cups 38 and 41 and the like through the vent holes 49. However, these vent hole 49 can be formed in the regions 50 immediately below the inlet ports 44. Further, no partition plate 48 can also be arranged.

FIGS. 10 to 12 show an example of the opening/closing operation by the opening/closing mechanism 45.

As shown in FIG. 10, when the window portion 43 is opened to allow transfer of the wafer W, the pressures inside and outside the processing chamber 30 become almost equal. The opening/closing plates 46 are closed to introduce the outer atmosphere to the processing chamber 30 via the window portion 43. In this case, a down flow from the window portion 43 to the exhaust port 40 is formed in the processing chamber 30.

As shown in FIG. 11, when the wafer W is accommodated in the processing chamber 30, and the window portion 43 is closed, the pressure in the processing chamber 30 becomes negative. The opening/closing plates 46 are opened to introduce the outer atmosphere to the processing chamber 30 via the inlet ports 44. In this case, a down flow from the inlet port 44 to the exhaust port 40 is formed in the processing chamber 30.

As shown in FIG. 12, for example, when the interior of the processing chamber 30 cannot be evacuated due to any cause, the pressures inside and outside the processing chamber 30 become almost equal. The opening/closing plates 46 are closed to make the processing chamber 30 airtight.

In the cleaning apparatus 1 of this embodiment, when the window portion 43 is opened to allow transfer of the wafer W, an air flow externally toward the inside of the processing chamber 30 via the window portion 43 is formed, so no atmosphere in the processing chamber 30 leaks outside via the window portion 43. When the interior of the processing chamber 30 cannot be evacuated due to any cause, the inlet ports 44 are closed, so no atmosphere in the processing chamber 30 leaks outside via the inlet ports 44. Therefore, the wafer W on, e.g., the wafer convey path is free from any adverse effect.

The second embodiment of the present invention will be described below.

A wafer cleaning apparatus 201 is constituted by integrally connecting a cassette station 210 for externally loading wafers W as target processing substrates into a system in units of a plurality of, e.g., 25 wafers for a wafer cassette CR, unloading them from the system, and loading/unloading the wafers W in/from the wafer cassette CR, and a cleaning station 211 in which various single-wafer cleaning units each for performing predetermined cleaning for the wafers W one by one are arranged at predetermined positions.

In the cassette station 210, as shown in FIG. 13, a plurality of, e.g., up to four wafer cassettes CR are mounted at the positions of alignment projections 220a on a cassette table 220 in a line along the X direction (vertical direction in FIG. 13) while directing their wafer entrances to the cleaning station 211 side. A wafer conveyor 221 movable in this cassette alignment direction (X direction) and the wafer alignment direction (Z direction; vertical direction) of the wafers stored in the wafer cassette CR selectively accesses the respective wafer cassettes CR. The wafer conveyor 221 is constituted to be rotatable in the θ direction, and can also access a wafer conveyor 222 on the cleaning station 211 side, as will be described later.

As shown in FIG. 13, the wafer conveyor 222 is arranged in the cleaning station 211. The wafer conveyor 222 is movable along the wafer convey path (Y direction). The cleaning units are arranged on the two sides of the convey path of the wafer conveyor 222. The wafer conveyor 222 of the cleaning station 211 is constituted to be rotatable also in the θ direction, and can access the respective cleaning units in addition to the above-described wafer conveyor 221 on the cassette station 210 side.

As shown in FIG. 13, e.g., four cleaning units are arranged on the two sides of the convey path of the wafer conveyor 222. A DIW cleaning unit for simply performing cleaning with a rinsing solution, e.g., deionized water (DIW), and an APM cleaning unit for performing cleaning using a cleaning solution, e.g., the APM are arranged on the front side of the apparatus, while a DHF cleaning unit using the DHF, and an HPM cleaning unit for performing cleaning using the HPM are arranged on the back side of the apparatus. At the remaining positions, these units or other units can be arranged.

FIG. 16 shows the arrangement of each cleaning unit. The APM, DHF, and HPM cleaning units basically have the same arrangement, as shown in FIG. 16.

As shown in FIG. 16, a chuck mechanism 231 for supporting the peripheral edge portion of the wafer W to rotate the wafer W is arranged below at almost the center in a closed processing chamber 230. Injection nozzles 233 and 234 for injecting a cleaning solution and the DIW to the wafer W are respectively arranged below and above the wafer W supported by the chuck mechanism 231. The cleaning solution and the DIW are supplied to the injection nozzles 233 and 234, as will be described later.

Figure 17:
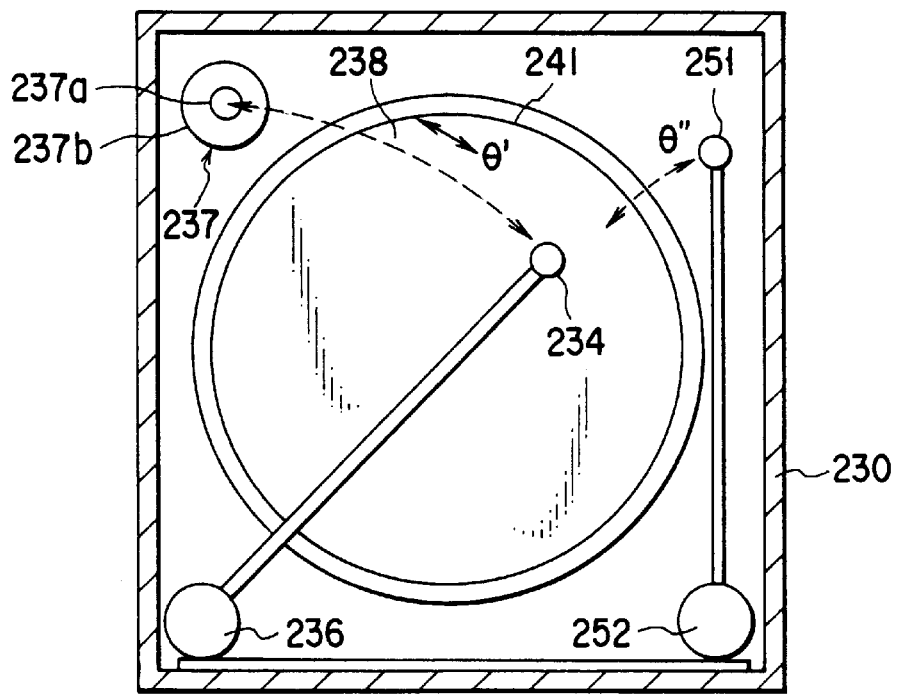
FIG. 17 is a plan view of the cleaning unit shown in FIG. 13.

As shown in FIG. 17, the injection nozzle 234 arranged above the wafer W is moved up and down within a predetermined range by a driving cylinder 236. The injection nozzle 234 is rotatable in the horizontal direction (θ' direction). With this arrangement, the injection nozzle 234 can be pivoted to a position falling outside the peripheral portion of the wafer W. A dummy dispenser 237 serving as a recovery portion for recovering the solution injected from the injection nozzle 234 is arranged at a predetermined position falling outside the peripheral portion of the wafer W, i.e., a position adjacent to first and second cups 238 and 241 (to be described later).

Figure 18:
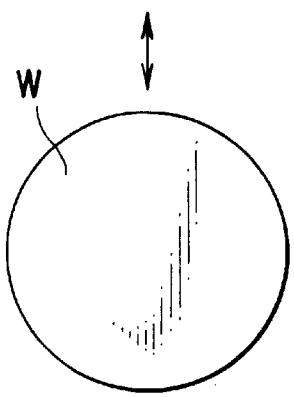
FIG. 18 is a sectional view of the dummy dispenser of the cleaning unit shown in FIG. 17.
Figure 18:
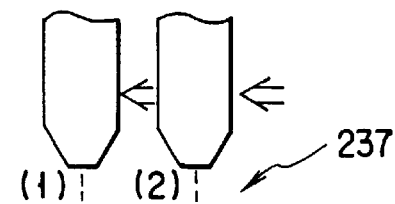
Figure 18:
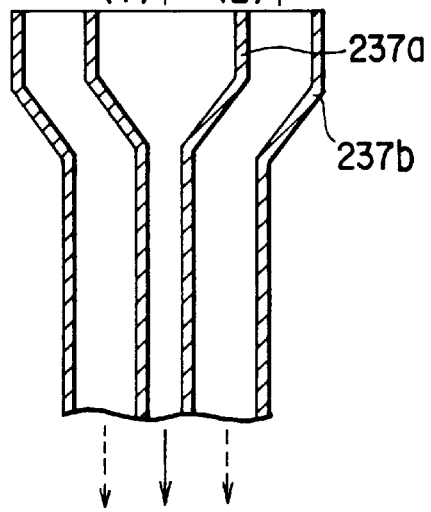

As shown in FIG. 18, the dummy dispenser 237 has a double cup structure with an inner cup 237a for recovering the cleaning solution injected from the injection nozzle 234, and an outer cup 237b for recovering the DIW injected from the injection nozzle 234.

As shown in FIG. 17, an injection nozzle 251 for injecting the N₂ purge gas, the IPA, or the like, and a driving cylinder 252 for rotating the injection nozzle 251 in the horizontal direction (θ" direction) and moving it up and down within a predetermined range are arranged on a side opposite to the arrangement side of the dummy dispenser 237 and the driving cylinder 236. The cleaning solution and the DIW on the wafer W are removed and dried by a gas injected from the injection nozzle 251.

The chuck mechanism 231, the injection nozzle 233, and the like are accommodated in a first cup 238 having a small diameter. The first cup 238 has an upper opening portion having a diameter slightly larger than the diameter of the wafer W. The wafer W is accommodated downward in the cup via the opening portion. An exhaust port 240 for evacuating the interior of the processing chamber 230 is formed in the lower surface of the first cup 238. A first discharge port 239 for discharging the solution recovered by the first cup 238 outside the cup is formed in the lower surface of the first cup 238.

The first cup 238 is accommodated in a second cup 241 having a diameter larger than that of the first cup 238. The second cup 241 has an upper opening portion having a diameter larger than that of the first cup 238. The wafer W is accommodated in the second and first cups via this opening portion. The opening portion of the second cup 241 is at a slightly higher level than the first cup 238. The solution scattered by the wafer W is recovered in the second cup 241 via an gap utilizing this height difference. A second discharge port 242 for discharging the solution recovered by the second cup 241 outside the cup is formed in the lower surface of the second cup 241. Since the discharge port is formed for each of the cups 238 and 241 in this manner, two solutions, i.e., the cleaning solution and the DIW, and two gases can be separated. Note that an exhaust port similar to that of the first cup 238 may be formed in the second cup 241. In this embodiment, the exhaust port 240 formed in the first cup 238 is used to evacuate the interior of the processing chamber 230. The first and second cups 238 and 241 are arranged with a predetermined relationship, as described above.

A window portion 243 for transferring the wafer W is formed in the front surface of the processing chamber 230 on the wafer convey path side. A door 235 of the window portion 243 can be opened/closed, e.g., vertically by a cylinder 232. The wafer conveyor 222 movably arranged on the wafer convey path transfers the wafer W to be cleaned to the processing chamber 230 via the window portion 243.

The door 235 of the window portion 243 is coupled to the cylinder 232 by a coupling member 260, and can be vertically moved on the basis of the operation of the cylinder 232. The first and second cups 238 and 241 are coupled integrally. The second cup 241 is also coupled to the coupling member 260. Therefore, the first and second cups 238 and 241 are vertically movable in synchronism with the vertical motion of the door 235 of the window portion 243, while maintaining their positional relationship.

When the opening portion of the second cup 241 is located at first, lowest position (1), the chuck mechanism 231 receives the wafer W from the wafer conveyor 222 via the window portion 243. The first and second cups 238 and 241 are moved up to locate the wafer W at second position (2) at the gap between their opening portions. Then, the wafer W is cleaned with, e.g., the DIW. The first and second cups 238 and 241 are further moved up to locate the wafer at position (3) below the opening portion of the first cup 238.

Then, the wafer W is cleaned with, e.g., a solution. Therefore, the DIW is recovered by the first cup 238, and the cleaning solution is recovered by the second cup 241.

FIG. 19 shows the arrangements of circulation and discharge systems for the cleaning solution and the DIW recovered by the first and second cups 238 and 241 and the dummy dispenser 237.

As shown in FIG. 19, the cleaning solution recovered by the first cup 238 and the cleaning solution recovered by the inner cup 237a of the dummy dispenser 237 are recovered to a cleaning solution bath 261. The cleaning solution bath 261 can store about 30 liters of cleaning solution.

A heater 262 for heating the stored cleaning solution is arranged below in the cleaning solution bath 261. The heater 262 heats the cleaning solution to about 40° C. when the cleaning solution is, e.g., the APM, and to about 80° C. when the cleaning solution is, e.g., the HPM. When the cleaning solution is the DHF, it is not generally heated. In this case, no heater 262 need be arranged. A cleaning solution inlet port in the cleaning solution bath 261 is preferably arranged below the heater 262, and a cleaning solution extraction port is preferably arranged above the heater 262. With this arrangement, the temperature of the cleaning solution in the cleaning solution bath 261 can be uniform.

A limit sensor group 263 for detecting the solution level of the stored cleaning solution to detect the cleaning solution amount is arranged at the side portion of the cleaning solution bath 261. The limit sensor group 263 is constituted to detect, e.g., the lowest and highest solution levels, and is used to replenish and control the cleaning solution. The number of sensors may be increased to perform finer detection, as a matter of course.

Tanks 264 and 265 for replenishing the cleaning solution bath 261 with the cleaning solution, e.g., $NH_4$ and $H_2O_2$ for the APM, and a DIW supply port 266 are connected to the upper portions of the cleaning solution bath 261. Since the cleaning solution is replenished from above the cleaning solution bath 261, it can be effectively agitated. The cleaning solution may be replenished, e.g., every predetermined time, every time the number of cleaned wafers W reaches a predetermined number, or in combination with them.

The cleaning solution stored in the cleaning solution bath 261 is supplied to the injection nozzles 233 and 234 via a cleaning solution circulation pump 267 and a cleaning solution filter 268. The cleaning solution circulation pump 267 and the cleaning solution filter 268 constitute a circulation system for circulating the cleaning solution used at the injection nozzles 233 and 234 and recycling it at the injection nozzles 233 and 234. The cleaning solution stored in the cleaning solution bath 261 is circulated again to the cleaning solution bath 261 via the cleaning solution circulation pump 267 and the cleaning solution filter 268. With this operation, the cleaning solution in the cleaning solution bath 261 is mixed, and its temperature is adjusted.

Switch portions 269 and 270 are respectively interposed between the cleaning solution filter 268 and the injection nozzle 234, and the filter 268 and the injection nozzle 233. The switch portion 269 is used to supply, to the injection nozzle 234, either one of the cleaning solution from the cleaning solution bath 261 and the DIW from a DIW supply port 271. The switch portion 270 is used to supply, to the injection nozzle 233, either one of the cleaning solution from the cleaning solution bath 261 and the DIW from a DIW supply port 272. Switching of the switch portions 269 and 270 is controlled by, e.g., a controller (not shown) at a timing (to be described later).

The DIW injected from the injection nozzles 233 and 234 to the wafer W is recovered by the second cup 241, and discharged from the discharge port 242. The DIW injected from the injection nozzle 234 to the dummy dispenser 237 is recovered by the outer cup 237b and discharged.

Figure 20:
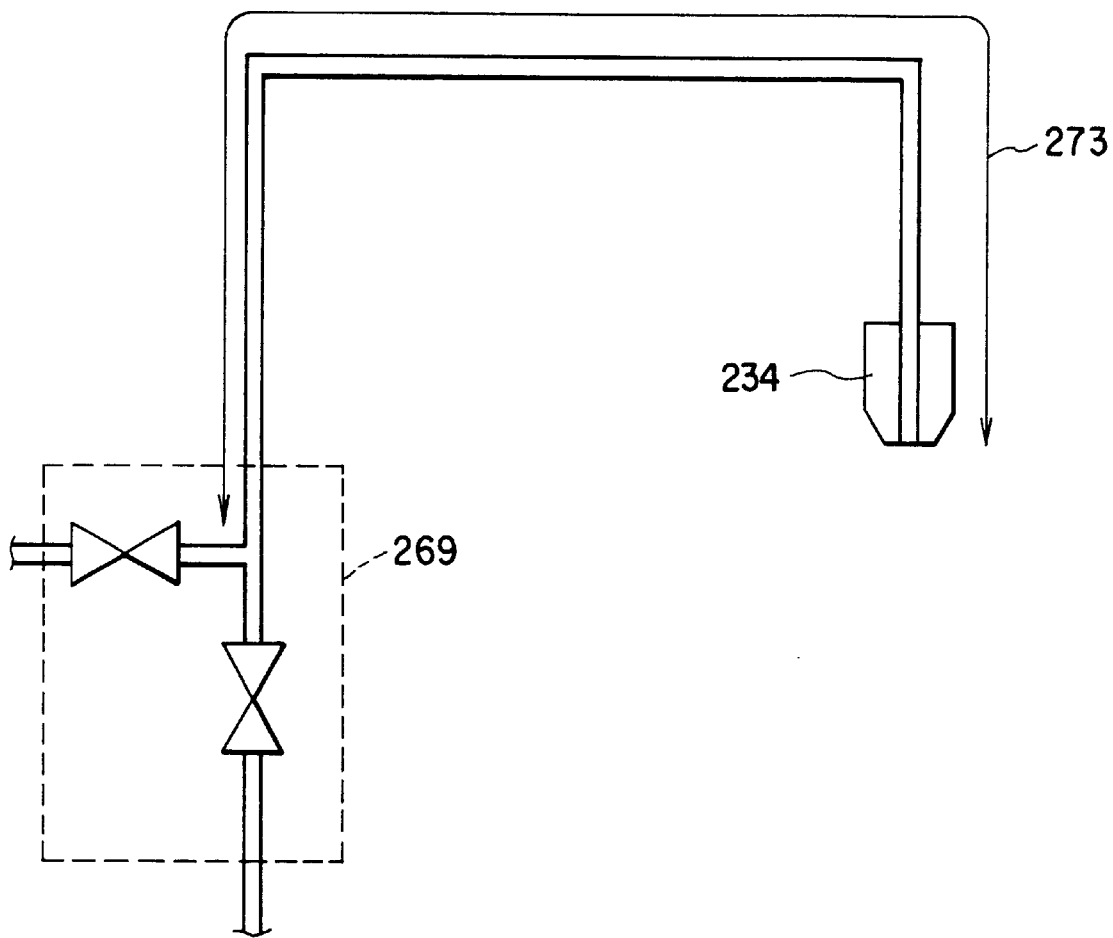
FIG. 20 is an enlarged view of an interval between an injection nozzle and a switch portion shown in FIG. 19.

In the arrangement wherein two types of liquids, i.e., the cleaning solution and the DIW are alternately injected from the same injection nozzle, when, e.g., the cleaning solution is injected from the injection nozzle to the wafer W, a rinsing solution remaining at an interval 273 between the injection nozzle 234 and the switch portion 269 is first injected to the wafer W, as shown in FIG. 20. When the rinsing solution is injected from the injection nozzle to the wafer W, the cleaning solution remaining at the interval 273 between the injection nozzle 234 and the switch portion 269 is first injected to the wafer W. For this reason, the cleaning solution adversely affects the wafer W, or a watermark or the like attaches to the wafer W.

In the wafer cleaning apparatus 201 according to this embodiment, before the injection nozzle 234 discharge the cleaning solution to the wafer W, it is moved to above the inner cup 237a of the dummy dispenser 237 (position (1) in FIG. 18), and caused to discharge the DIW remaining at the interval 273 between the injection nozzle 234 and the switch portion 269 for a predetermined period. Before the injection nozzle 234 injects the DIW to the wafer W, it is moved to above the outer cup 237b of the dummy dispenser 237 (position (2) in FIG. 18), and caused to discharge the cleaning solution remaining at the interval 273 between the injection nozzle 234 and the switch portion 269 for a predetermined period.

With this operation, when the cleaning solution is to be injected to the wafer W, no DIW remaining in the injection nozzle 234 is injected to the wafer W. When the DIW is to be injected to the wafer W, no cleaning solution remaining in the injection nozzle 234 is injected to the wafer W. Cleaning can be more satisfactorily performed.

As described above, in the wafer cleaning apparatus 201 of this embodiment, the cleaning solution injected from the injection nozzles 233 and 234 to the wafer W, and the cleaning solution injected from the injection nozzle 233 to the dummy dispenser 237 are recovered, circulated, and recycled. With this arrangement, the consumption amount of cleaning solution used for cleaning can be decreased to reduce the running cost. In addition, the cleaning solution bath 261 can be downsized to reduce the space cost.

In the wafer cleaning apparatus 201, the cleaning portion has the double cup structure constituted by the first and second cups 238 and 241. The dummy dispenser 237 also has the two inner and outer cups 237a and 237b. Therefore, only the cleaning solution can be recovered and recycled with a simple arrangement. Since the wafer cleaning apparatus 201 uses the two injection nozzles 233 and 234 to clean the upper and lower surfaces of the wafer W, the throughput of cleaning can be improved. Since the injection nozzles 233 and 234 are constituted to inject two types of solutions, i.e., the cleaning solution and the DIW from one injection nozzle, the apparatus can be downsized.

The wafer W is cleaned with the cleaning solution in the first cup 238, and with the DIW in the second cup 241. That is, the wafer W is cleaned with the cleaning solution at the lower portion, and with the DIW at the upper portion. With this arrangement, the atmosphere along with the cleaning solution does not influence the wafer W cleaned with the DIW. The cleaning solution does not adversely affect the wafer W. Note that the apparatus can be reversely arranged: the wafer W is cleaned with the DIW in the first cup 238, and with the cleaning solution in the second cup 241. That is, the wafer W is cleaned with the DIW at the lower portion, and with the cleaning solution at the upper portion. With this arrangement, the cleaning solution can be more efficiently recovered.

The present invention is not limited to the above-described embodiments, and can be variously modified within the technical scope.

For example, the above embodiments have exemplified the case wherein the present invention is applied to the APM, DHF, and HPM cleaning units. However, the present invention can also be applied to another cleaning unit for DIW cleaning or the like. Further, the present invention can also be applied to a processing unit such as a resist unit, in addition to the cleaning unit. In short, the present invention can be applied to any unit as far as the unit is constituted to evacuate the interior of a closed processing chamber.

The units may be arranged in multiple stages in the vertical direction (Z direction).

The target processing substrate is not limited to a semiconductor wafer, and can be an LCD substrate, a glass substrate, a CD substrate, a photomask, a printed board, a ceramic substrate, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A processing apparatus for processing a target processing substrate, comprising:

a closed processing chamber for performing predetermined processing for the target processing substrate;

an openable window portion formed in said processing chamber, and used to transfer the target processing substrate;

an inlet port formed in the processing chamber to introduce an outer atmosphere;

exhaust means for evacuating an interior of the processing chamber; and an opening/closing mechanism for closing said inlet port when a pressure in the processing chamber is not negative, and opening said inlet port when the pressure in said processing chamber is negative.

2. A processing apparatus for processing a target processing substrate, comprising:

a closed processing chamber for performing predetermined processing for the target processing substrate;

an openable window portion formed in said processing chamber, and used to transfer the target processing substrate;

an inlet port formed in the processing chamber to introduce an outer atmosphere;

exhaust means for evacuating an interior of the processing chamber; and an opening/closing mechanism for closing said inlet port when a pressure in the processing chamber is not negative, and opening said inlet port when the pressure in said processing chamber is negative, said opening/closing mechanism including an opening/closing plate axially supported to open/close said inlet port, and a counterweight balancing said opening/closing plate so as to cause said opening/closing plate to close said inlet port when the pressure in said processing chamber is not negative, and open said inlet port when the pressure in said processing chamber is negative.

3. An apparatus according to claim 2, wherein the window portion is formed in a front surface of said processing chamber:

said inlet port is formed in an upper surface of said processing chamber; and said exhaust means is arranged below in said processing chamber.

4. An apparatus according to claim 3, further comprising:

a partition plate arranged in said processing chamber, having a vent hole, and separating a processing portion from said inlet port thereabove.

5. An apparatus according to claim 4, wherein said partition plate has the vent hole in a region except for a predetermined region of said partition plate immediately below said inlet port.

6. A processing apparatus for cleaning a target processing substrate, comprising:

cleaning means for cleaning the target processing substrate by using cleaning and rinsing solutions;

a circulation system coupled to said cleaning means to circulate the cleaning solution used by said cleaning means and recycle the cleaning solution in said cleaning means; and a discharge system coupled to said cleaning means to discharge the rinsing solution used by said cleaning means;

wherein said cleaning means includes;

an accommodation portion with a double cup structure in which opening portions allowing loading/unloading of the target processing substrate are formed, and the opening portion of an inner cup is at a lower level than that of an outer cup;

a rotation portion for holding and rotating the target processing substrate within said accommodation portion; and an injection portion for injecting one of the cleaning and rinsing solutions to the target processing substrate rotated within said inner and outer cups by said rotation portion;

wherein said circulation system circulates the cleaning solution recovered by one of said inner and outer cups, and recycles the cleaning solution at said injection portion; and wherein said discharge system discharges the rinsing solution recovered by the other of said inner and outer cups.

7. An apparatus according to claim 6, wherein said injection portion injects one of the cleaning and rinsing solutions to upper and lower surfaces of the target processing substrate.

8. An apparatus according to claim 6, wherein said injection portion injects the cleaning solution to upper and lower surfaces of the target processing substrate rotated within said inner cup by said rotation portion, and the rinsing solution to said upper and lower surfaces of the target processing substrate rotated within said outer cup by said rotation portion; and wherein said circulation system circulates the cleaning solution recovered by said inner cup, and recycles recycle the cleaning solution at said injection portion; and said discharge system discharges the rinsing solution recovered by said outer cup.

9. An apparatus according to claim 6, wherein said injection portion injects the cleaning solution to upper and lower surfaces of the target processing substrate rotated within said outer cup by said rotation portion, and the rinsing solution to said upper and lower surfaces of the target processing substrate rotated within said inner cup by said rotation portion;

wherein said circulation system circulates the cleaning solution recovered by said outer cup, and recycles the cleaning solution at said injection portion; and wherein said discharge system discharges the rinsing solution recovered by said inner cup.

10. An apparatus according to claim 6, further comprising:

a control portion for controlling a vertical relative positional relationship between said accommodation portion with the double cup structure, and said rotation portion for holding the target processing substrate.

11. A cleaning apparatus for cleaning a target processing substrate, comprising:

an injection portion for alternately injecting cleaning and rinsing solutions to the target processing substrate by using a single injection nozzle;

a cleaning solution recovery portion for recovering the cleaning solution injected from said injection nozzle;

a rinsing solution recovery portion for recovering the rinsing solution injected from said injection nozzle;

discharge means for discharging the cleaning solution to said cleaning solution recovery portion from said injection nozzle for a predetermined period before said injection portion injects the cleaning solution to the target processing substrate, and discharging the rinsing solution to said rinsing solution recovery portion from said injection nozzle for a predetermined period before said injection portion injects the rinsing solution to the target processing substrate; and a circulation system for circulating the cleaning solution recovered by said cleaning solution recovery portion, and recycling the cleaning solution at said injection portion.

12. A cleaning apparatus for cleaning a target processing substrate, comprising:

an injection portion for alternately injecting cleaning and rinsing solutions to the target processing substrate by using a single injection nozzle;

a cleaning solution recovery portion for recovering the cleaning solution injected from said injection nozzle;

a rinsing solution recovery portion for recovering the rinsing solution injected from said injection nozzle;

discharge means for discharging the cleaning solution to said cleaning solution recovery portion from said injection nozzle for a predetermined period before said injection portion injects the cleaning solution to the target processing substrate, and discharging the rinsing solution to said rinsing solution recovery portion from said injection nozzle for a predetermined period before said injection portion injects the rinsing solution to the target processing substrate;

a circulation system for circulating the cleaning solution recovered by said cleaning solution recovery portion, and recycling the cleaning solution at said injection portion; and nozzle moving means for moving said injection nozzle between said injection portion, said cleaning solution recovery portion, and said rinsing solution recovery portion;

wherein said cleaning solution recovery portion is arranged adjacent to said injection portion, said rising solution recovery portion is arranged adjacent to said injection portion;

wherein said discharge means causes said nozzle moving means to move said injection nozzle to said cleaning solution recovery portion to discharge the cleaning solution from said injection nozzle to said cleaning solution recovery portion for a predetermined period before said injection portion injects the cleaning solution to the target processing substrate, and causes said nozzle moving means to move said injection nozzle to said rinsing solution recovery portion to discharge the rinsing solution from said injection nozzle to said rinsing solution recovery portion for a predetermined period before said injection portion injects the rinsing solution to the target processing substrate.

13. A cleaning apparatus comprising:

an injection portion for alternately injecting cleaning and rinsing solutions to a target processing substrate by using a single injection nozzle;

a recovery portion with a double cup structure which is arranged adjacent to said injection portion, and has an inner cup for recovering one of the cleaning and rinsing solutions injected from said injection nozzle, and an outer cup for recovering the other;

nozzle moving means for moving said injection nozzle between said injection portion and said recovery portion;

means for causing said nozzle moving means to move said injection nozzle to one of said cups to discharge the cleaning solution from said injection nozzle for a predetermined period before said injection portion injects the cleaning solution to the target processing substrate, and causing said nozzle moving means to move said injection nozzle to the other cup to discharge the rinsing solution from said injection nozzle for a predetermined period before said injection portion injects the rinsing solution to the target processing substrate; and a circulation system for circulating the cleaning solution recovered by a cleaning solution recovery portion, and recycling the cleaning solution at said injection portion.

14. A cleaning apparatus for cleaning a single substrate, comprising:

cleaning means having a nozzle configured to alternately eject a chemical etching solution and a rinsing solution to the substrate;

a circulation path communicated with said nozzle, configured to recover the chemical etching solution used in the cleaning means and to recycle the chemical etching solution used in the cleaning means; and a discharge path communicated with said nozzle, configured to discharge the rinsing solution used in the cleaning means;

wherein said chemical etching solution is at least one of an ammonia-hydrogen peroxide mixture, an hydrochloric acid-hydrogen peroxide mixture and a diluted hydrofluoric acid.

15. A cleaning apparatus for cleaning a substrate comprising:

cleaning means being movable between a home position and an operating position, and having a common nozzle configured to alternately eject a chemical etching solution and a rinsing solution to the substrate from the operating position;

a first circulation path configured to supply the chemical etching solution to said common nozzle;

a second circulation path supply configured to supply the rinsing solution to said common nozzle;

switching means, communicated with said first and second circulation paths, for changing said first and second circulation paths; and a dummy dispenser arranged between the home and operating positions and having a first cup which is arranged to receive the chemical etching solution ejected by the common nozzle just before an application of the chemical etching solution to the substrate and a second cup which is arranged to receive the rinsing solution ejected by the common nozzle just before an application of the rinsing solution to the substrate.

16. An apparatus according to claim 15, wherein said chemical etching solution is at least one of an ammonia-hydrogen peroxide mixture, an hydrochloric acid-hydrogen peroxide mixture and a diluted hydrofluoric acid.

17. An apparatus according to claim 15, wherein said first cup is concentric with said second cup and is provided inside said second cup.

18. An apparatus according to claim 15, further comprising a circulation path which is communicated with said first cup and with said common nozzle and which is configured to circulate the chemical etching solution received by said first cup to said common nozzle so that the chemical etching solution is recycled in the cleaning means.

* * * * *